United States Patent
Nagata et al.

[11] Patent Number: 6,014,503
[45] Date of Patent: Jan. 11, 2000

[54] COMPUTER AIDED BUILDING RENOVATION SUPPORTING SYSTEMS

[75] Inventors: Yoichi Nagata, Neyagawa; Sachio Nagamitsu, Kyoto; Hisashi Kodama, Ikoma; Mayumi Sakai, Moriguchi; Tsuneko Imagawa, Hirakata, all of Japan

[73] Assignee: Matsushita Electric Industrial Co., Ltd., Osaka, Japan

[21] Appl. No.: 08/771,238

[22] Filed: Dec. 20, 1996

[30] Foreign Application Priority Data

Dec. 22, 1995 [JP] Japan .................................. 7-334431
May 30, 1996 [JP] Japan .................................. 8-136666

[51] Int. Cl.[7] .................................................. G06F 17/50
[52] U.S. Cl. ................ 395/500.01; 345/964; 364/474.24
[58] Field of Search ........................ 364/468.03, 468.04, 364/468.02, 474.22, 474.24; 395/500.01; 345/326, 339, 348, 355, 964

[56] References Cited

U.S. PATENT DOCUMENTS

| | | | |
|---|---|---|---|
| 4,642,780 | 2/1987 | Thomson | 364/512 |
| 4,964,060 | 10/1990 | Hartsog | 364/512 |
| 5,255,352 | 10/1993 | Falk | 395/125 |
| 5,307,295 | 4/1994 | Taylor et al. | 364/578 |
| 5,337,149 | 8/1994 | Kozah et al. | 356/376 |
| 5,630,043 | 5/1997 | Uhlin | 345/474 |
| 5,668,736 | 9/1997 | Douglas et al. | 364/512 |

FOREIGN PATENT DOCUMENTS

| | | |
|---|---|---|
| 1-200479 | 8/1989 | Japan . |
| 4-257059 | 9/1992 | Japan . |
| 6-295326 | 10/1994 | Japan . |

*Primary Examiner*—Viet D. Vu
*Attorney, Agent, or Firm*—Ratner & Prestia

[57] ABSTRACT

To provide a building renovation supporting apparatus capable of drafting and presenting efficient renovation plan, the proposing means 51 creates the renovation blueprints composed of third dimensional path diagrams of particular view-point, line of sight direction and the view angle corresponding to each types of condition of the symbol diagram to be inputted from the inputting means 10 with many view-point information, visual lien direction information and the view angle information necessary for drafting the third dimensional path diagrams being corresponding to various types of condition of one type of symbol diagrams such as position, direction, angle or the like respectively.

27 Claims, 21 Drawing Sheets

Fig. 12

| Article Number | 3D Diagram | Texture | | | |
|---|---|---|---|---|---|
| | | modern | natural | dandy | elegant |
| NR-317SKN | FZH0 | refrigerator 2M | refrigerator 2N | refrigerator 2D | refrigerator 2E |
| NA-A40X2-WH | RCT0 | washing machine 1 | washing machine 1 | washing machine 1 | washing machine 1 |
| BT01 | BT01 | bath 1M | bath 1N | bath 1D | bath 1E |
| K105 | KI-I-03 | kitchen 3 | kitchen 3 | kitchen 3 | kitchen 3 |

| Construction Type Code | Room Type | Position | Construction setting | Texture File | | | |
|---|---|---|---|---|---|---|---|
| | | | | modern | natural | dandy | elegant |
| 206020400 | Japanese style room | wall | repairing | wall paper 105 | wall paper 111 | wall paper 122 | wall paper 135 |
| 206020500 | Western style room | wall | repairing | wall paper 201 | wall paper 215 | wall paper 220 | wall paper 235 |
| 207010000 | Western style room | floor | reconstruction | floor 11 | floor 21 | floor 36 | floor 46 |
| 207010100 | Japanese style room | floor | repairing | tatami (mat) 1 | tatami (mat) 1 | tatami (mat) 1 | tatami (mat) 1 |

FIG. 13

COMPUTER AIDED BUILDING RENOVATION SUPPORTING SYSTEMS

BACKGROUND OF THE INVENTION

1. Field of the Invention

The present invention relates generally to a building renovation supporting system usable in housing planning at the renovation of the building.

2. Related art of the Invention

Recently, demands for housing are diverse due to various needs by consumers. It commonly takes a lot of troubles and time to select not only bodies, but fitting appliances when the house is newly built. As in FIG. 8, personal computers CAD can be used to select not only furnishings from the room arrangement planning blueprints, but also to select housing-related fittings appliances such as air conditioning appliances and so on. End users can plan houses with understanding, effect automatic adding calculation by an adding calculating apparatus 81 of wood allotting or the like, and further, can print written estimates by the outputting apparatus 82.

Renovation of the housing is popular due to higher prices of land. Accordingly, renovation planning is commonly effected with partial use of only the blueprint creating function or the estimating function of the CAD adding calculation for the conventional use.

But the CAD adding calculating system of the conventional construction had defects in that sufficient planing support was not given to the renovation plan by the renovation of the housing. It was impossible to add in calculation only the renovation portion. Also, it was impossible to set various types of construction which was required in the case of many repairing construction in the renovation. Namely, it was not necessary to set the various types of construction, because new construction was handled collectively. Further, it was impossible for amateur, not specialist, except for first-class architects, to decide the construction type by interfering with the contents of various types of constructions. Further, although the default construction execution patterns are sometimes prepared as recommendation plan even in the CAD adding calculation system appropriate to the new constructing, there was none of the renovation, because planning presenting of the efficient renovation planning could not be effected.

Also, in the presenting method of the renovation finishing, it is very difficult, in the conventional third dimensional color path diagram, to judge the actual finishing condition, such as length feelings, whether or not the existing furniture or furniture to be purchased newly after the renovation goes well with the wall paper after the renovation, and to predict whether or not the further to be purchased newly after the renovation can be placed in terms of size.

Therefore, there is caused in the finishing image between the construction contractor and the user which may cause troubles.

SUMMARY OF THE INVENTION

An object of the invention to provide a building renovation supporting system capable of panning presenting more efficient renovation planning than before in accordance with the renovation of the building, considering such problem as the conventional CAD adding calculation system.

BRIEF DESCRIPTION OF THE INVENTION

Figure 11A:
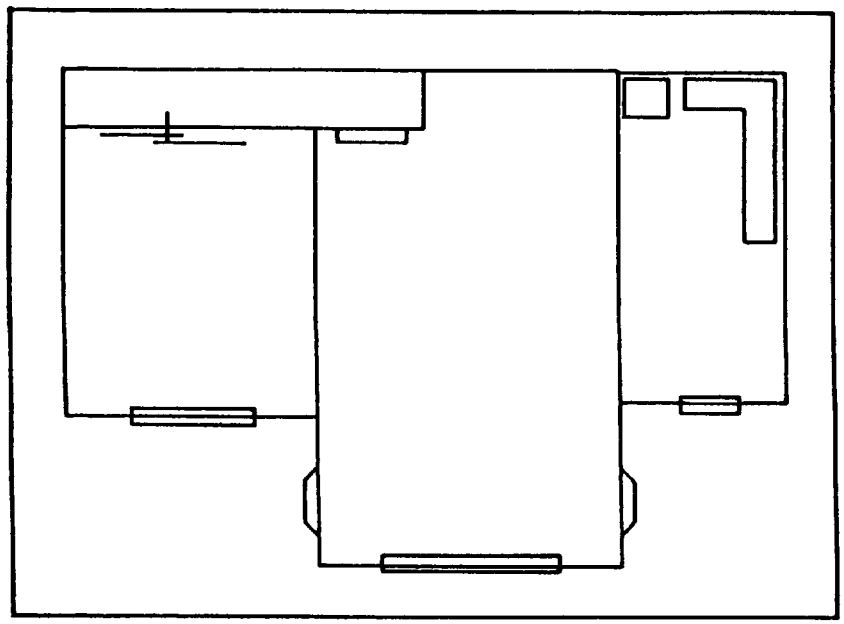
Figure 11B:
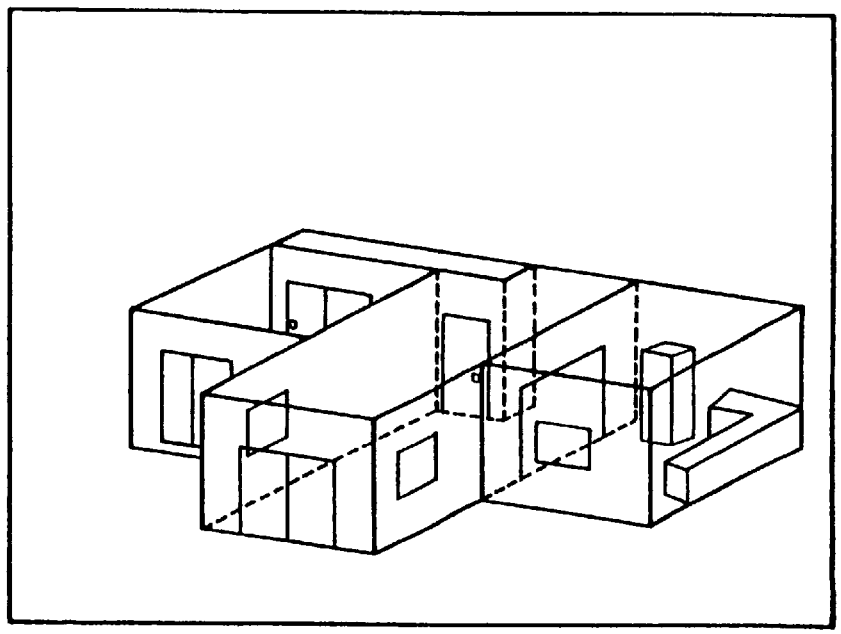

FIGS. 11(*a*), 11(*b*) show renovation blueprint to be created by the proposing apparatus of the building renovation supporting apparatus; renovation supporting CAD addition calculating system in one embodiment of the invention;

FIG. 12 shows diagram showing one example of shape of fittings appliance/furnishings/furniture the proposing apparatus of the building renovation supporting apparatus has or fittings appliance/furnishings/furniture texture table for setting texture.

Figure 14A:
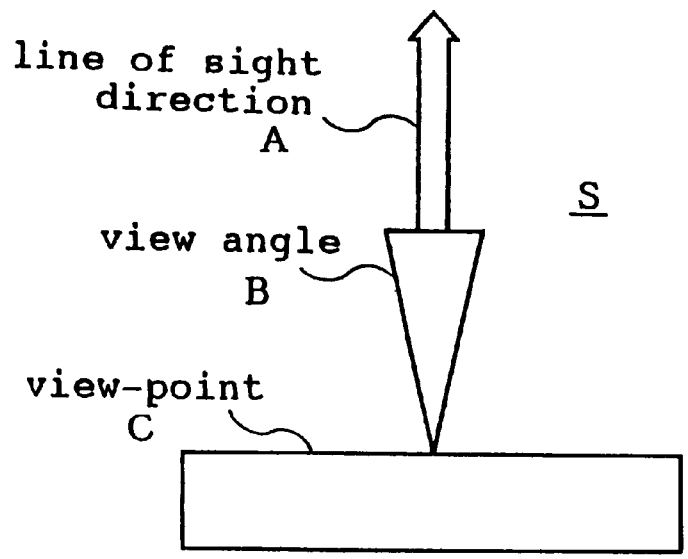
Figure 14B:
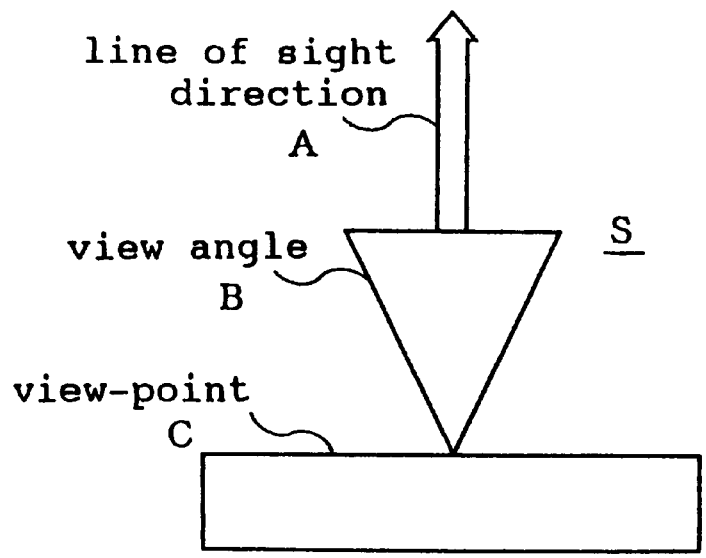
Figure 15A:
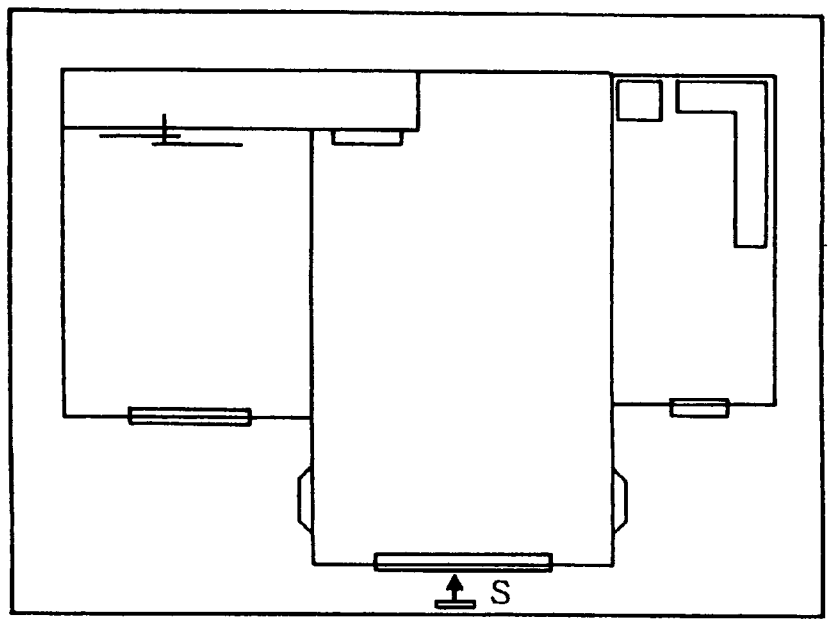
Figure 15B:
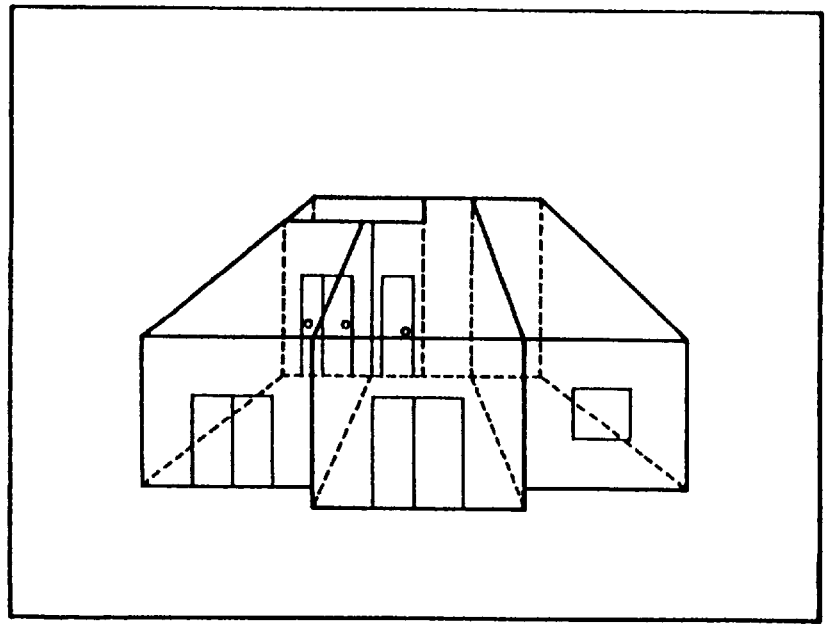
Figure 16A:
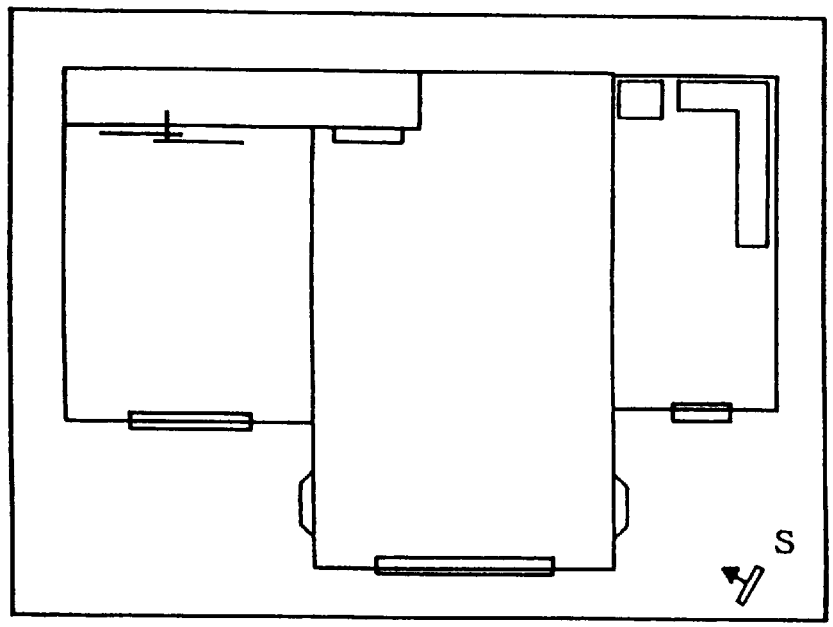
Figure 16B:
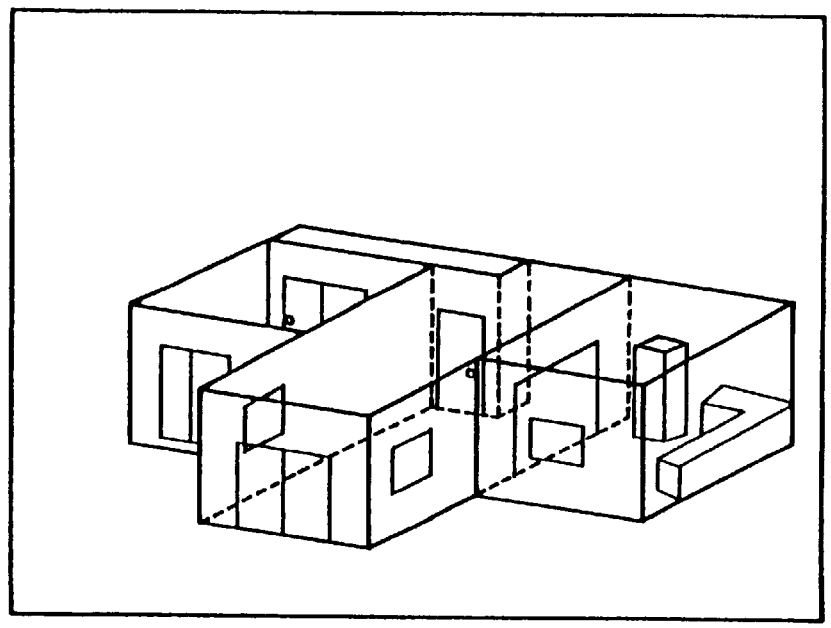
Figure 17:
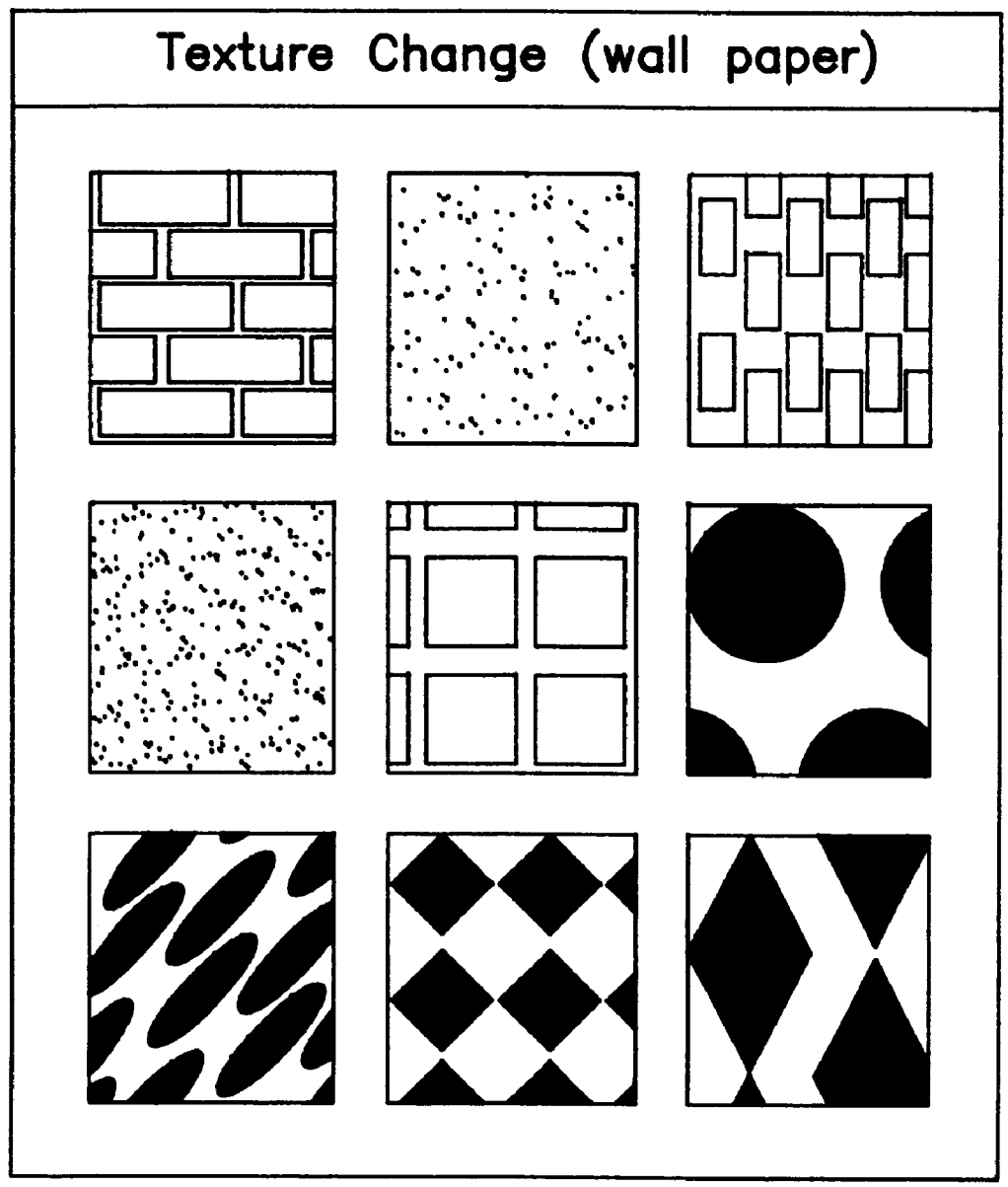
Figure 18A:
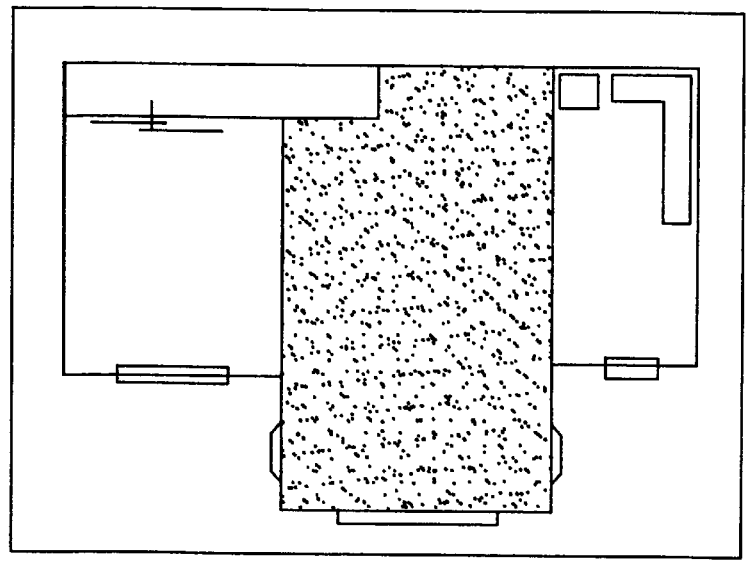
Figure 18B:
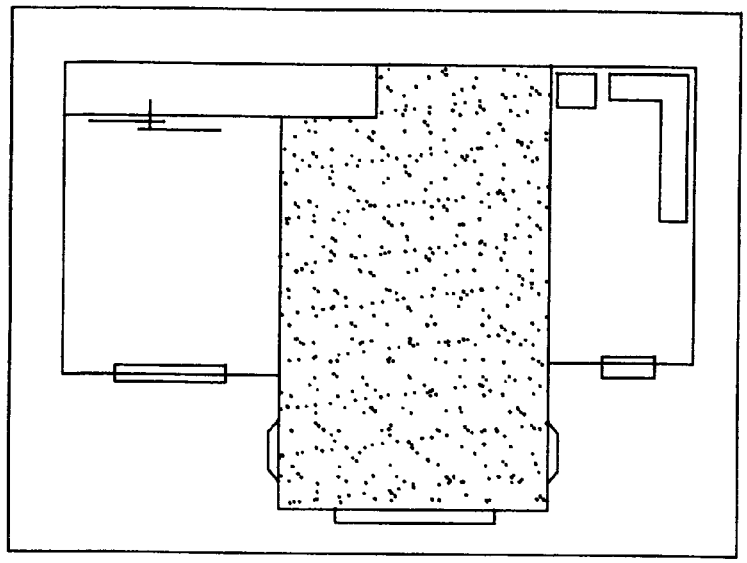
Figure 19A:
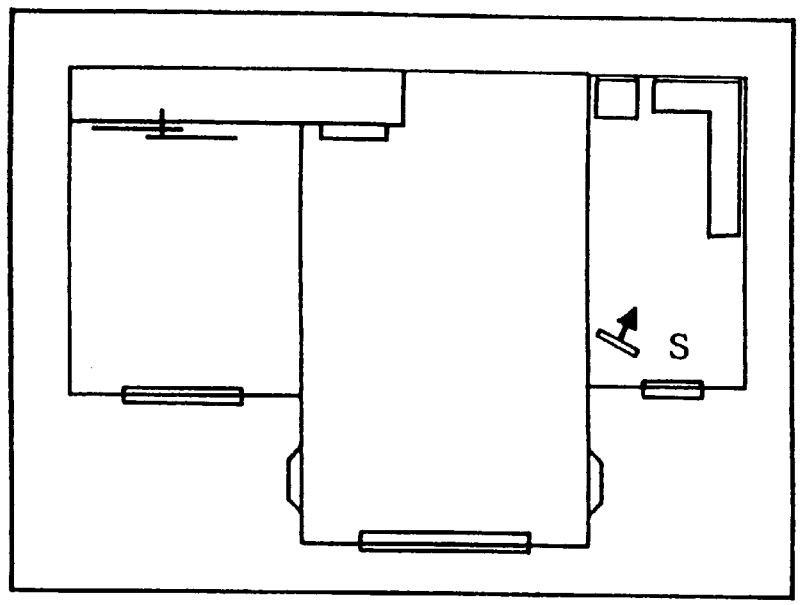
Figure 19B:
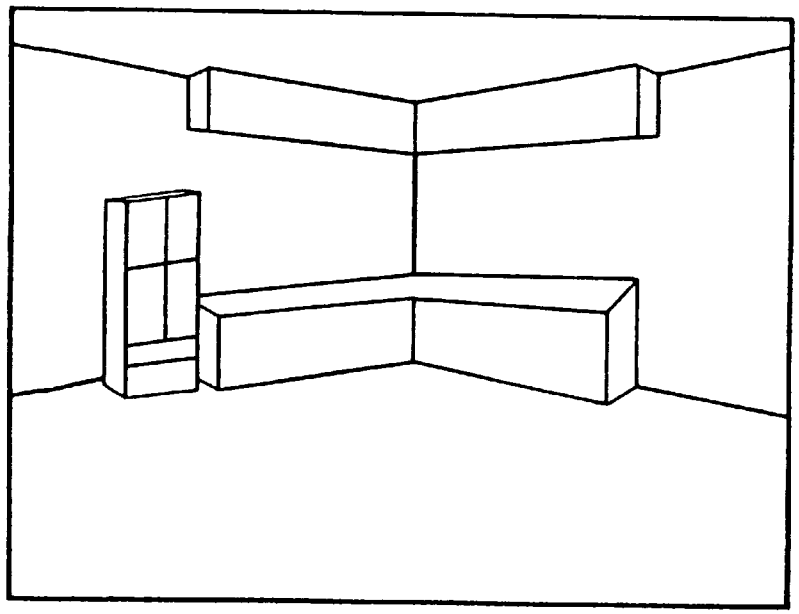
Figure 20A:
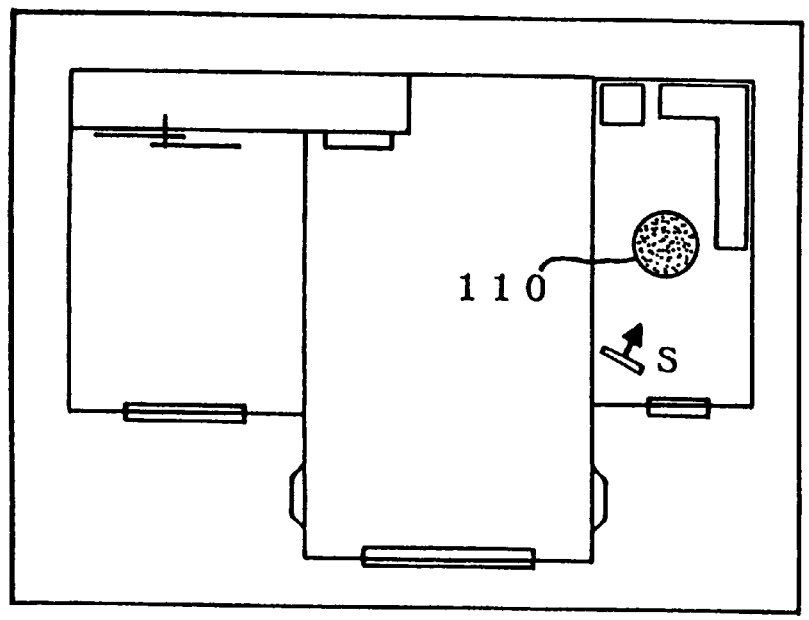
Figure 20B:
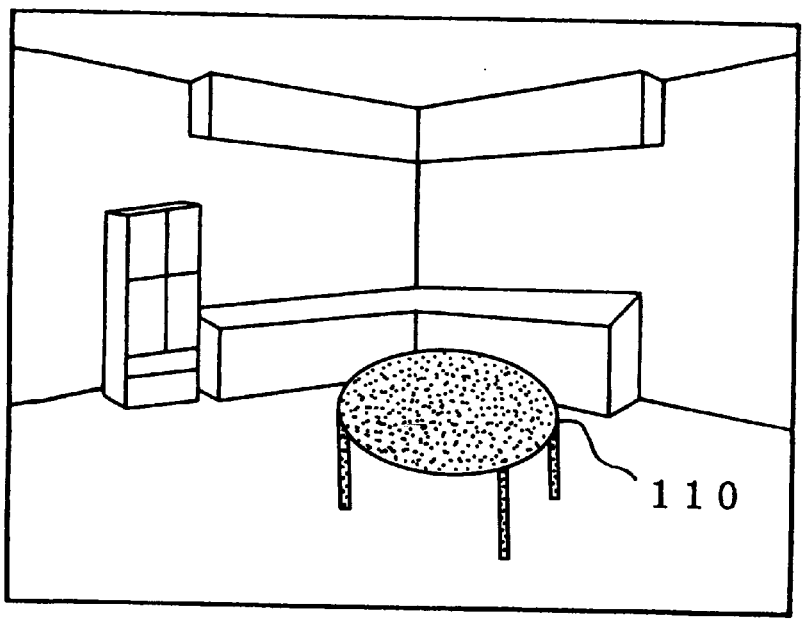
Figure 21A:
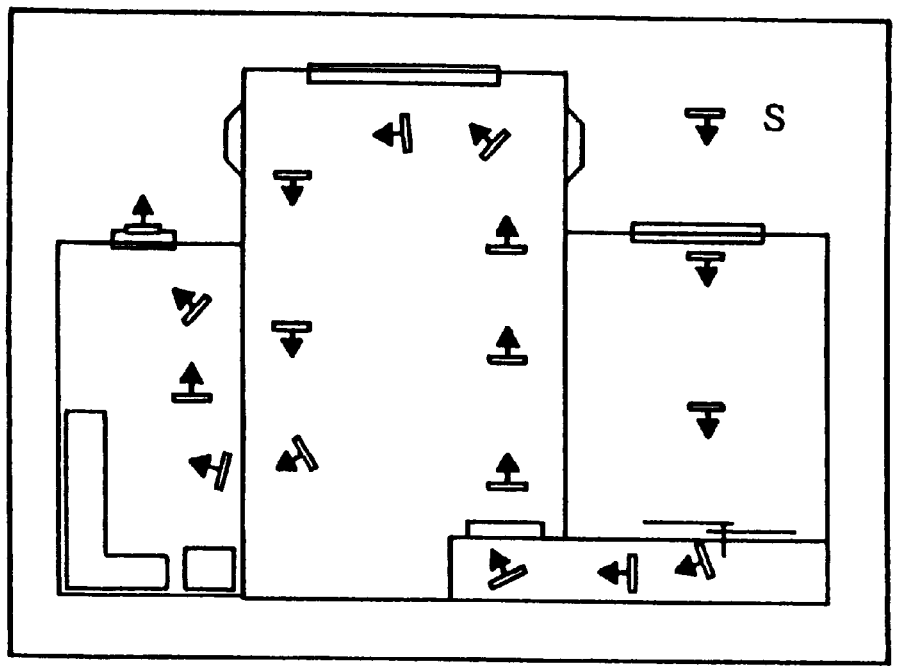
Figure 21B:
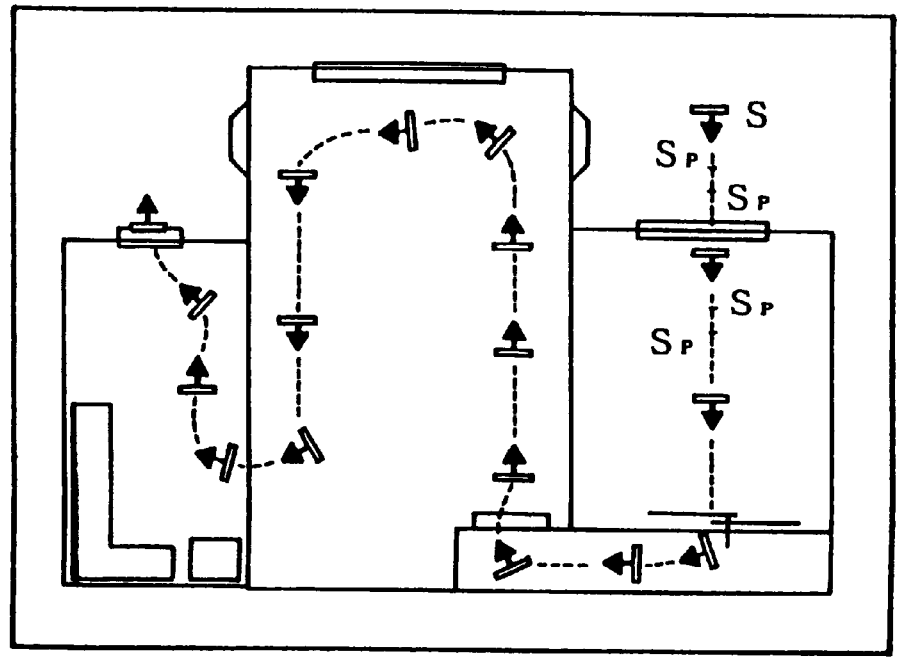

FIG. 13 is a diagram showing one example of texture accommodated for each room type and each interior image the proposing apparatus of the building renovation supporting apparatus has;

FIGS. 14(*a*), 14(*b*) is a view showing one example of visual change symbol the proposing apparatus of the building renovation supporting apparatus has;

FIGS. 15(*a*), 15(*b*) show a condition the visual point change symbol proposing apparatus of the building renovation supporting apparatus has, FIG. 15(*a*) shows the viewpoint of the visual point change symbol, FIG. 15(*b*) shows the third dimensional blueprint corresponding to the viewpoint of the visual point change symbol;

FIGS. 16(*a*), 16(*b*) show a condition the visual point change symbol proposing apparatus of the building renovation supporting apparatus has, FIG. 16(*a*) shows the viewpoint of the visual point change symbol, FIG. 16(*b*) shows the third dimensional blueprint corresponding to the viewpoint of the visual point change symbol;

FIG. 17 is a view showing one example of texture list proposing apparatus of the building renovation supporting apparatus has;

FIGS. 18(a), 18(b) is a view showing the change example of the interior image of the renovation blueprint for creation by proposing apparatus of the building renovation supporting apparatus has;

FIGS. 19(a), 19(b) show the renovation front blueprint before furniture is placed on the renovation blueprint made by proposing apparatus of the building renovation supporting apparatus has, FIG. 19(a) shows the view-point of the visual point change symbol, FIG. 19(b) shows the third dimensional blueprint corresponding to the view-point of the visual point change symbol;

FIGS. 20(a), 20(b) show the renovation front blueprint before furniture is placed on the renovation blue print made by proposing apparatus of the building renovation supporting apparatus has, FIG. 20(a) shows the view-point of the visual point change symbol, FIG. 20(b) shows the third dimensional blueprint corresponding to the view-point of the visual point change symbol;

FIGS. 21(a), 21(b) show a second dimensional blue print for illustrating an automatic walk-through function the proposing apparatus of the building renovation supporting apparatus has, FIG. 21(a) shows the view-point of the visual point change symbol, FIG. 21(b) shows spline.

1. inputting apparatus
2. CAD apparatus
3. displaying apparatus
4. diagram file
5. addition calculating apparatus
7. construction type file
9. option apparatus
10. inputting apparatus
20. displaying apparatus
30. outputting apparatus
40. building renovation CAD adding calculating system
41. CAD apparatus
42. addition calculating apparatus
43. outputting controlling apparatus
44. option apparatus
45. diagram file
46. addition calculating file
47. construction type file
48. other file
50. building renovation proposing system
51. proposing apparatus
52. image table
53. fitting appliance texture table
54. texture file
55. 3D diagram data
100. outputting apparatus
110. table

DESCRIPTION OF THE PREFERRED EMBODIMENTS

Figure 1:
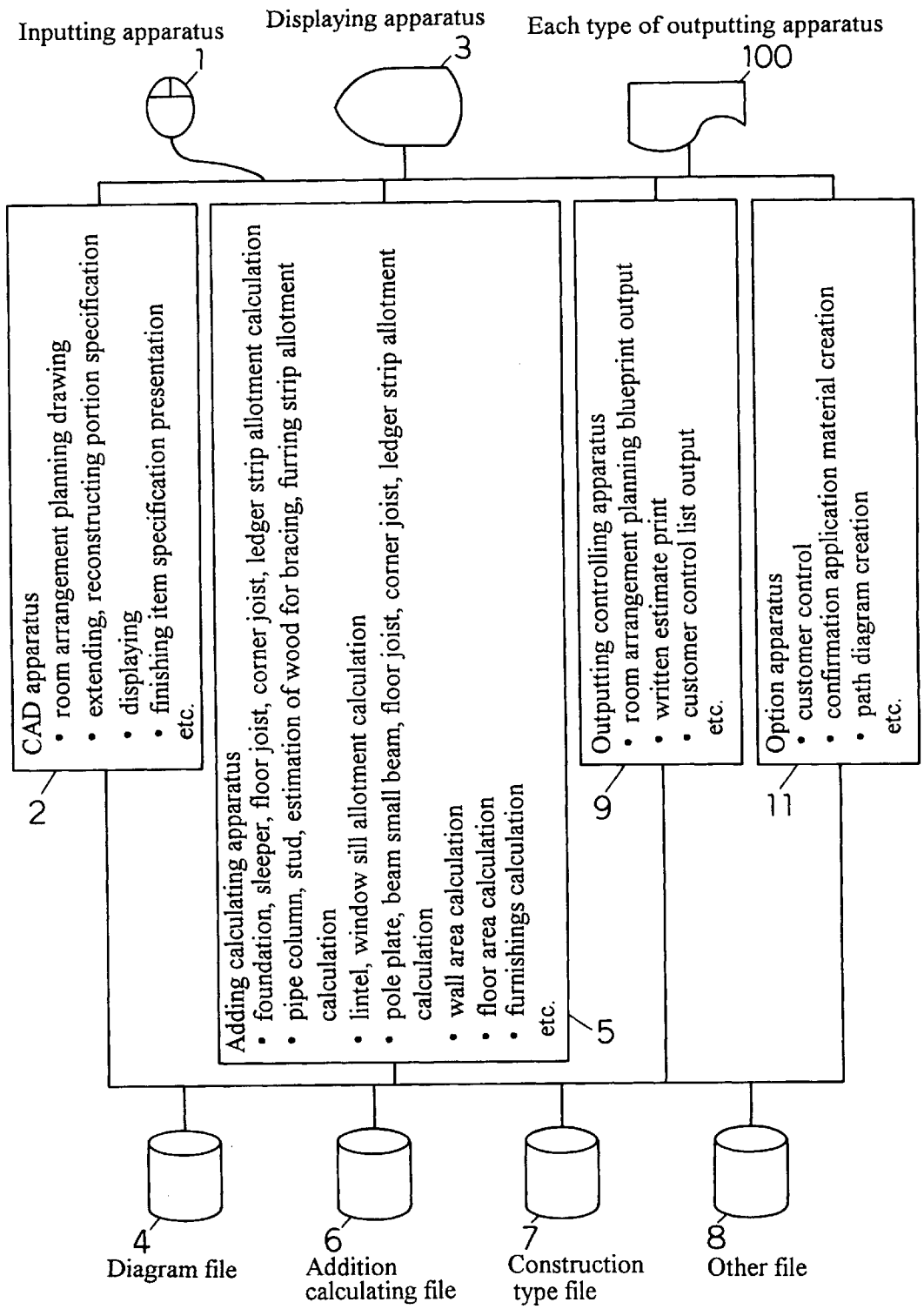
FIG. 1 is a whole construction view of a building renovation supporting CAD adding calculating system in one embodiment of the invention.

The embodiments of the invention will be described hereinafter with reference to the drawings. FIG. 1 is a schematic block diagram of a CAD addition calculating system of a housing reformation support in one embodiment of the invention. The construction and operation of the embodiment will be described with the use of the drawings.

Referring now to FIG. 1, the CAD apparatus 2 presents the blueprints of the room arrangement planning or the like on the displaying apparatus in accordance with figure information inputted with an input apparatus 1 such as mouth, keyboard or the like. The blueprint information is retained in a figure file 4. The addition calculating apparatus 5 retains the results calculated the area and so on of the floor or the like in the addition calculating filing 6 in accordance with the figure information. In this case, data retained in the construction files 7 are used about various types of constructions, finishing names or the like to be set in the CAD apparatus 2 and the addition calculating apparatus 5. The information of the facilities appliances or the like are controlled in the other files B. Thereafter, various outputting apparatus 10 such as plotter or the like are used by the output controlling apparatus 9 for printer-outputting room arrangement planning blueprints, written estimate or the like. Also, an option apparatus 11 can control customer management and so on also. Here the input means of the invention reacts to the inputting apparatus 1 and the CAD apparatus 2, while the displaying means of the invention reacts to the displaying apparatus 3. Also, the designating means of the invention includes the CAD apparatus 2 or the like. The estimate processing means of the invention includes the addition calculating apparatus 5 for effecting wood picking up calculation.

Figure 2:
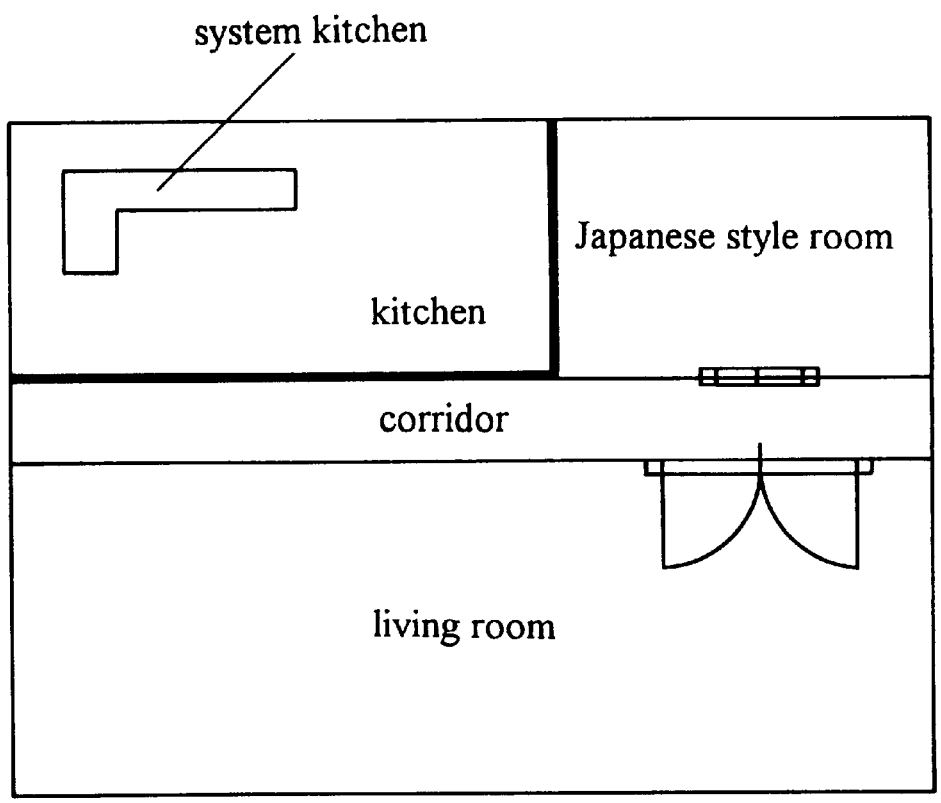
FIG. 2 is an input example of a room arrangement planning of the building renovation supporting CAD adding calculating system in one embodiment of the invention.
Figure 3:
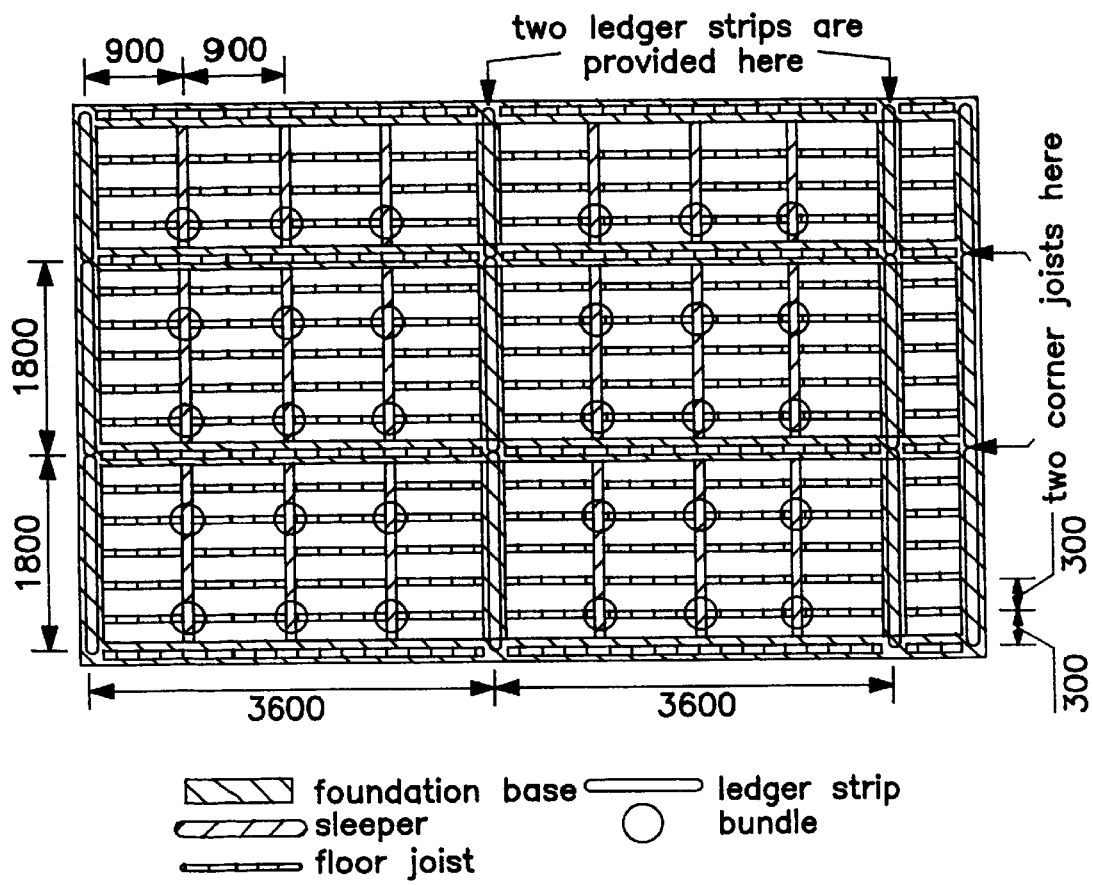
FIG. 3 shows an example where foundation, sleeper, floor joist, corner joist, ledger strip are made by adding calculating means of the building renovation supporting CAD addition calculating system in one embodiment of the invention.
Figure 4:
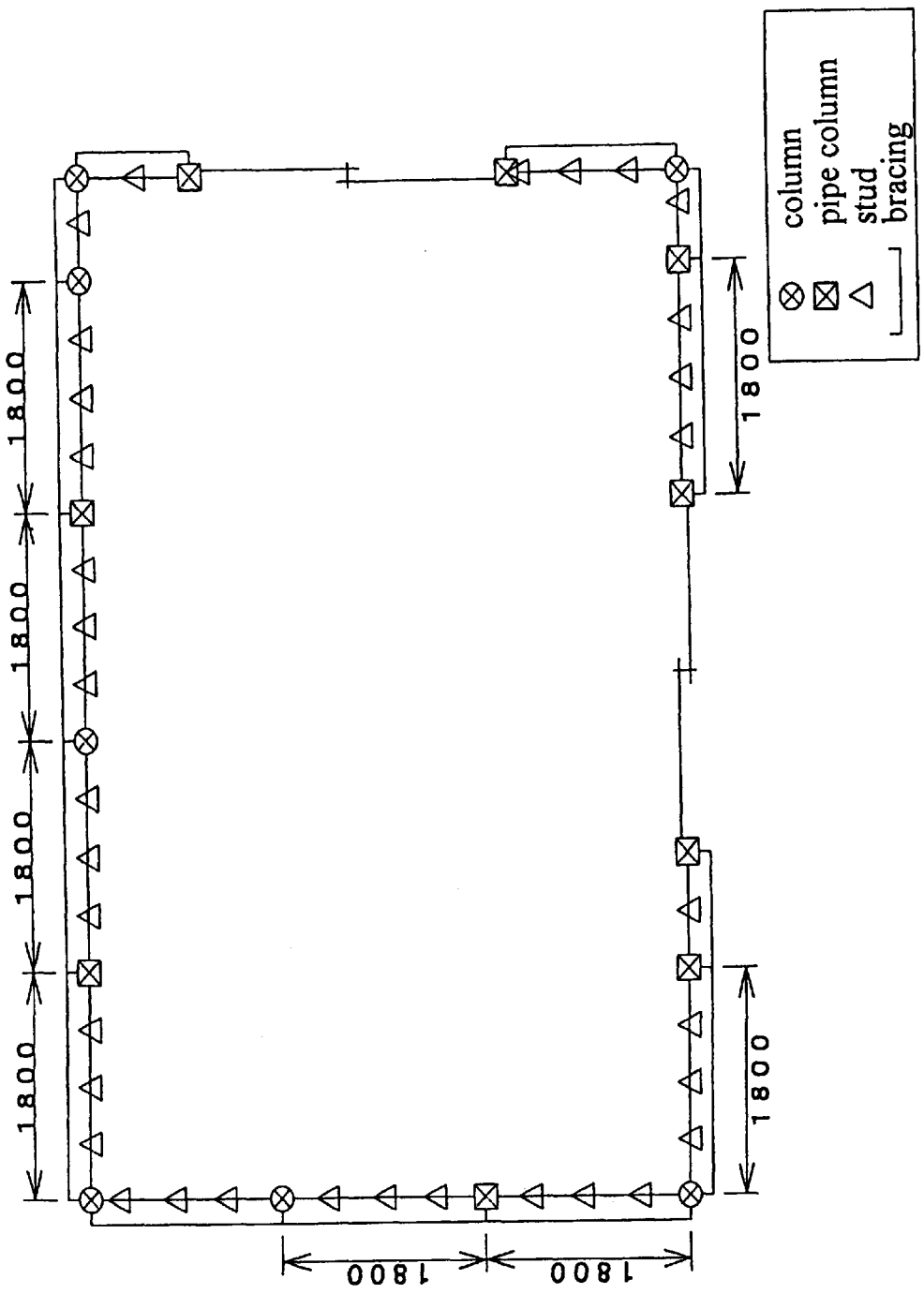
FIG. 4 shows an example where a column, pipe column, a stud, bracing are made by the addition calculating means of the housing renovation support CAD addition calculating system in one embodiment of the invention.
Figure 5:
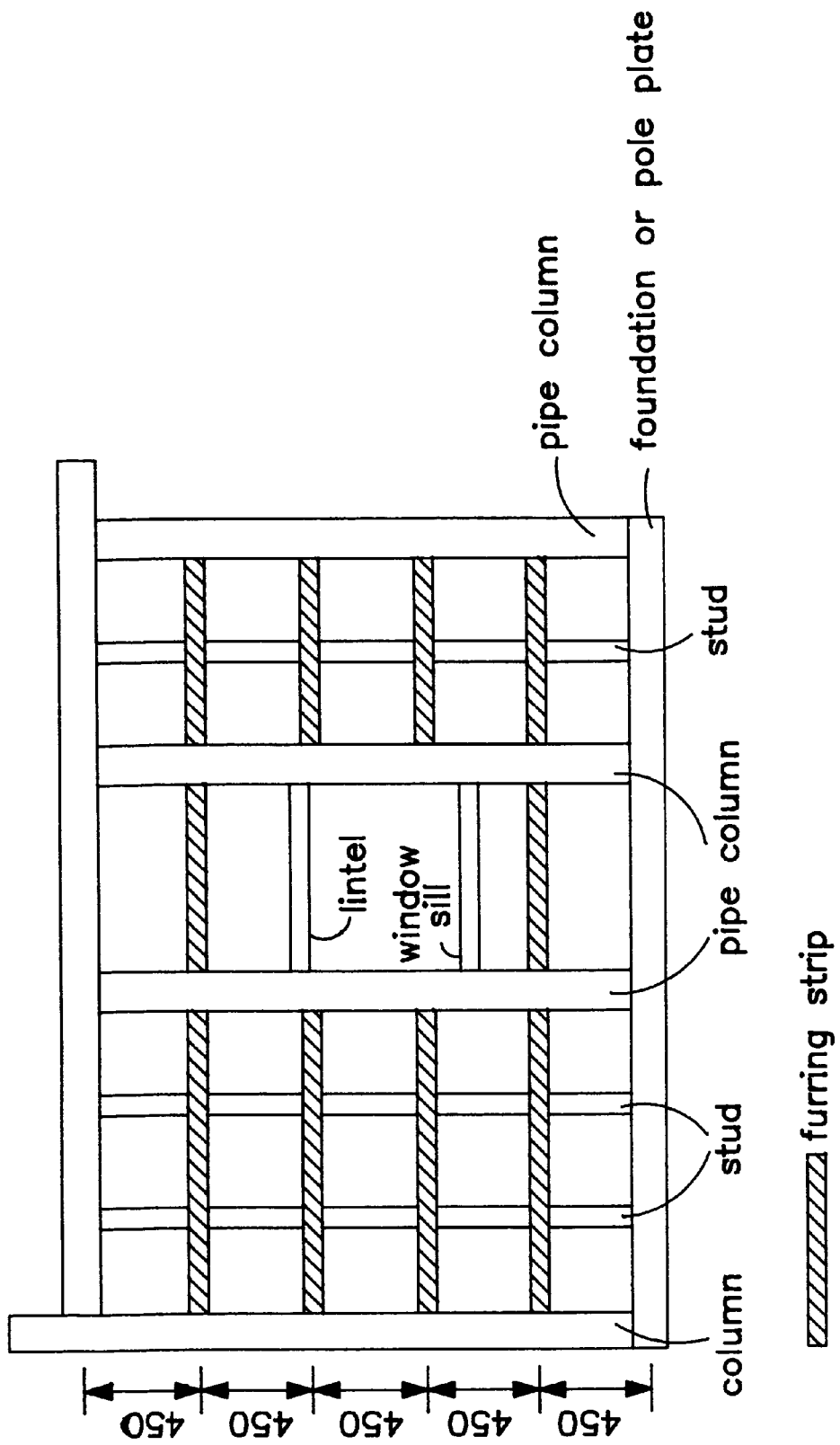
FIG. 5 shows an example wherein furring strip, window sill, a window lintel are made by the addition calculating means of the building renovation supporting CAD addition calculating system in one embodiment of the invention.
Figure 6:
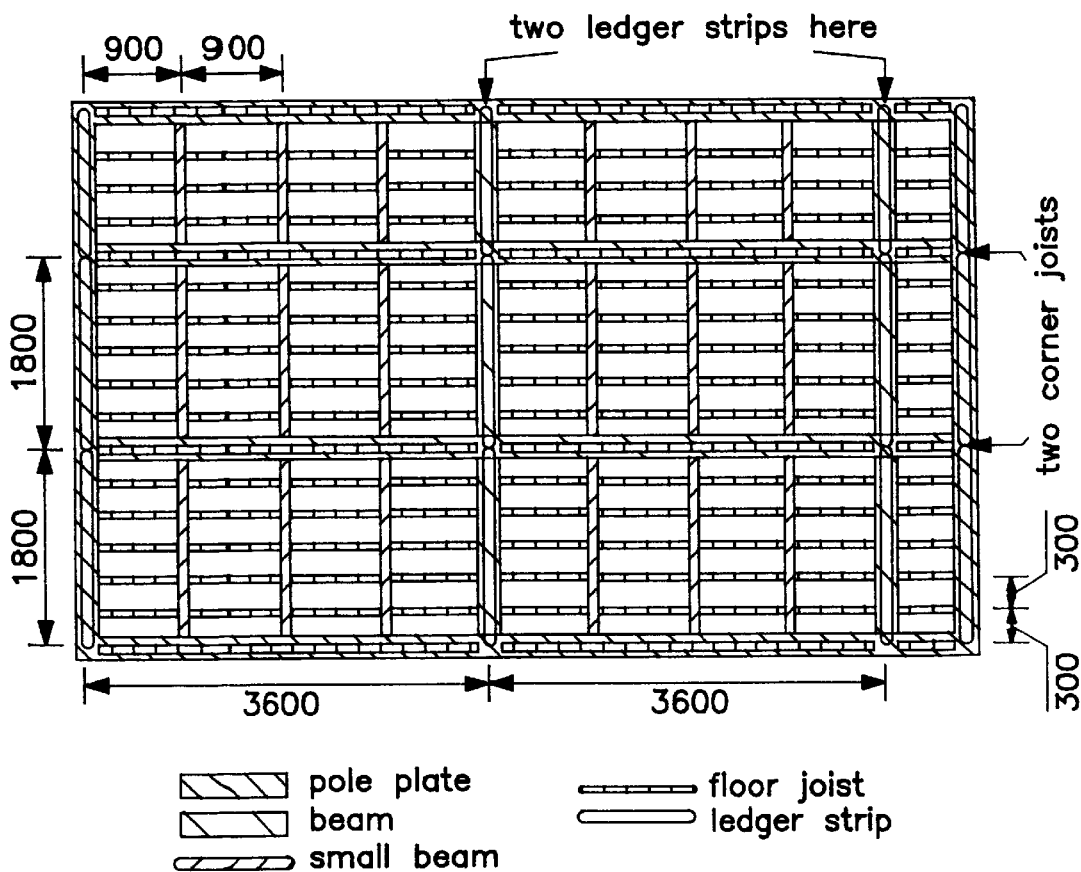
FIG. 6 shows an example, wherein pole plate, beam, small beam, floor joist, ledger strip are made by the addition calculating means of the building renovation supporting CAD addition calculating system in one embodiment of the invention.

FIG. 2 is an input example of the room arrangement planning blueprint. FIG. 3 is an example where foundation, sleeper, floor joist, corner joist, ledger strip are produced with respect to the first-story floor in the wood allotment calculation of the addition calculating apparatus. FIG. 4 is an example where column, pipe column, stud, bracing are produced in the wood allotment calculation of the addition calculating apparatus 5. FIG. 5 is an example where furring strip, window sill, lintel are produced in the existence of the furnishings on one side of the outer peripheral of the floor in the wood allotment calculation of the addition calculating apparatus 5. FIG. 6 is an example wherein pole plate, beam, small beam, floor joist, ledger strip are produced with respect to the second story in the wood allotment calculation of the addition calculating apparatus 5.

In such construction, the concrete operation in the present embodiment will be described with the use of FIG. 3 through FIG. 7.

At first, at first, the example shown in FIG. 2 will be described.

FIG. 2 is an input example of the room arrangement blueprint. At first, a room arrangement planning is drawn with the use of a given input apparatus 1 about the existing housing. In this example, a living room and a Japanese style room exist with a corridor placed between the two room. Thereafter, a renovation is planned and a room arrangement planning is drawn as described above although a kitchen room adjacent to the Japanese room is expected to be added. And the walls of the kitchen room can be displayed with thicker lines with the use of designating displaying function of the adding, renovating portions of the CAD apparatus 2.

As the result, in the present room arrangement planning, the kitchen has been recognized as an adding region. At the same time, the adding designation can be effected with the same function even when facilities apparatuses such s system kitchen or the like exist within, for example, the kitchen. Continuously, the finishing of he construction type files 7 can be selected properly and set for each position by the finishing item setting function of the CAD apparatus 2. Thereafter, the adding calculation including walls, floor, ceiling area, accompanying construction tools, facilities are expected by the producing apparatus 5. At this time, wood choosing calculation of only the extension portion.

Accordingly, the calculation of the extending, reforming portions peculiar to the renovation and the written estimate can be made, which was impossible to effect in the CAD addition calculation system corresponding to the conventional newly built house.

According to the above described embodiment, in the CAD adding system of the house renovating support, the setting of extending, renovating portions only can be easily set, recognized on the CAD and the calculation, estimation including the wood choosing calculation of the enlargement, renovation portions only.

Although a case where a kitchen is extended newly to a portion where existing building is not provided in the above described embodiment, there is a case or the like where a room is built newly in the location after the existing wall and the room was removed in addition to the above described case.

Figure 7:
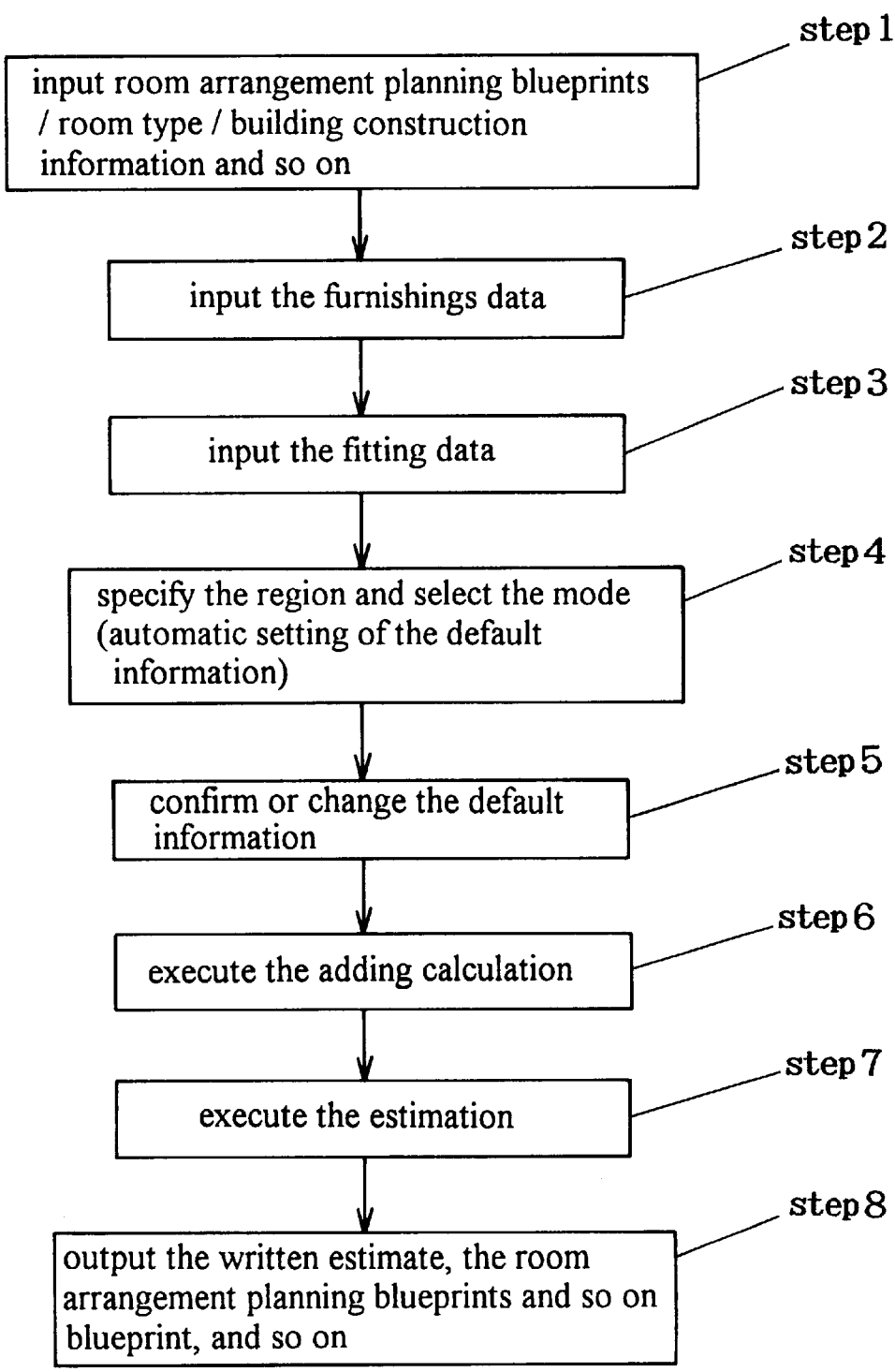
FIG. 7 is a flow chart of the building renovation supporting CAD addition calculating system in one embodiment of the invention.
Figure 8:
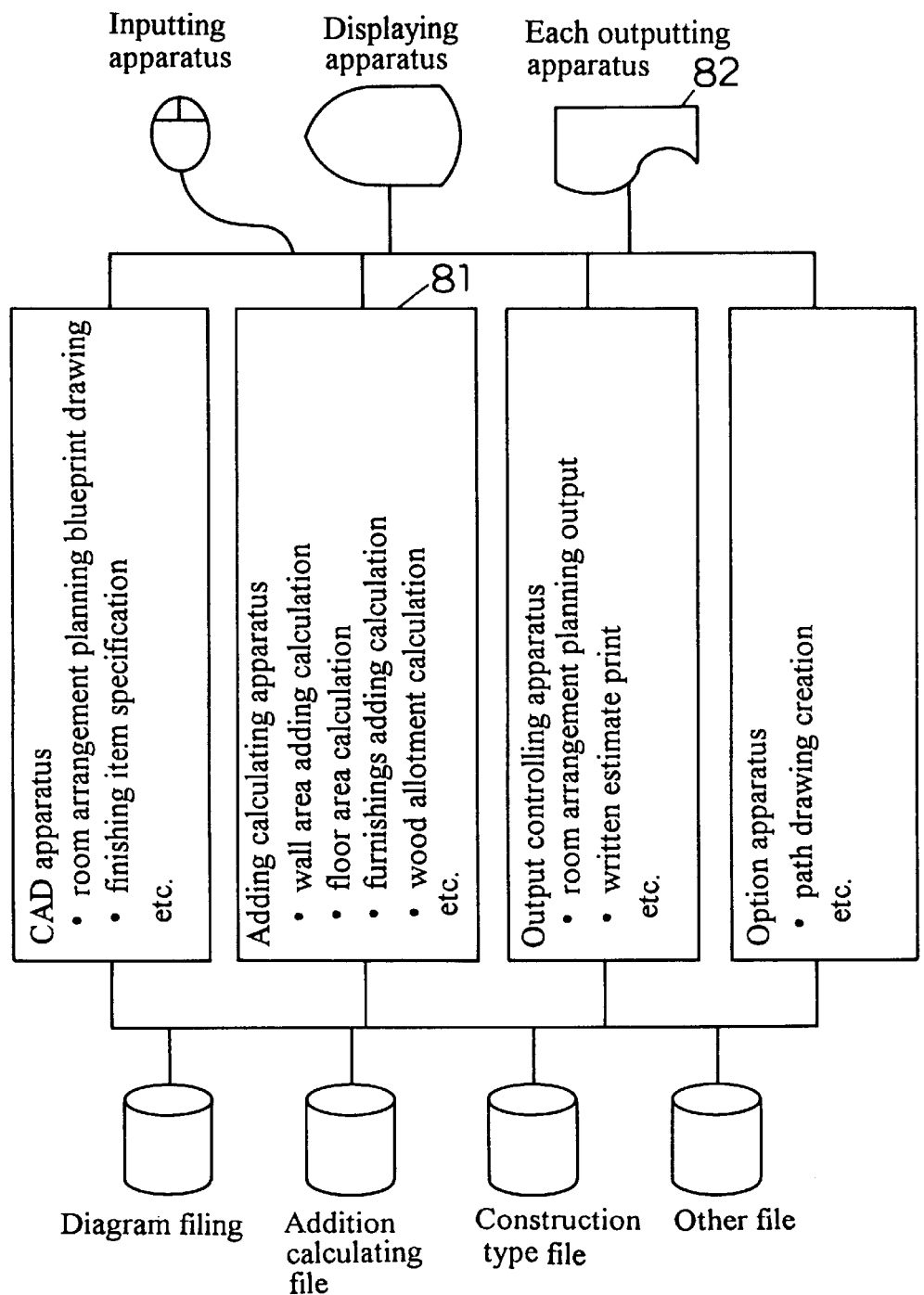
FIG. 8 is a block diagram of the conventional building renovation supporting CAD addition calculating system in one embodiment.

More concretely, the operation of the CAD addition calculating system of the housing renovation support in the case of the embodiment of FIG. 2 will be described with the use of FIG. 3 through FIG. 6 showing the flow chart of FIG. 7 and the wood choosing results.

A step 1; at first, the division of the wooden house or reinforced concrete is inputted as the construction of the building. Then, the room arrangement planning blueprint of the existing built is inputted when a kitchen is extended. The room arrangement planning blueprints doe not usually all the buildings. On the regions related to the construction has only to be provided. In the FIG. 2, the corridor and Japanese style room only may be inputted. Further, the kitchen to be extended is inputted. And the type of the room is inputted. The classification of the rooms such as Japanese style room, western style room or kitchen is specified to designate each wall as inner or outer. The designation is effected with the inputting apparatus 1 or the like through the room arrangement planning blueprints shown on the displaying apparatus 3 after the inputting operation. These information is inputted likewise when the construction object is one portion, of the building, such as wall, ceiling, floor or the like.

Step 2; Then, data of the type of furnishings such as door, window, sliding door, Oyako door, bow window or the like provided in the extended kitchen are added into the room arrangement planning blueprints.

Step 3; Then, fittings to be kitchen to be extended are inputted. As the data about the types of fittings are constructed as displayed in the list on the displaying apparatus 3, for example, kitchen, air conditioner or the like are selected from the list. Chief data necessary for the estimation of the extended building has been inputted.

Step 4; Then, when a mode of the construction is selected, first, the room arrangement planning blueprint of the building already inputted is displayed on the displaying apparatus 3. In the case of the present embodiment, the region of the extension is specified on the scenery displaying of the displaying apparatus 3 with the use of the inputting apparatus 1. For example, the boundary line of the region specified like this is displayed with kitchen liens for easier viewing though changes in the displaying color of the region. And an extension mode with respect to the region is selected from among the five selections of extending mode, a withdrawing mode, a renovating mode, displaying mode, an existing mode to be displayed on the displaying apparatus 3. At this time point, the construction information of the default corresponding to the construction mode is automatically set. And the step advances to a step 5.

Step 5; Here the construction information of the region where extension mode, the withdrawing mode, the renovating mode, the replacing mode can be confirmed. About the item necessary for changing, the changing designation of the data is effected with the use of the inputting apparatus 1, the CAD apparatus 2 or the like through viewing of the displaying apparatus 3.

The processing of the steps 1 through 5 is repeated when necessary.

Step 6; Here, the addition is effected by the adding apparatus 5 in according to the various types of data inputted already at the above described step.

In the case of the present embodiment, the addition including the divisions of the wall and floor, ceiling area and the building construction which are necessary for estimation of the extension of the kitchen, and accompanying furnishings, fittings. And except for the above described various types of data, wood choosing calculation is effected in accordance with the floor shape, thus resulting in FIG. 3 through FIG. 6. The method of calculating the wood choosing of FIG. 3 through FIG. 6 will be described hereinafter.

Referring now to FIG. 3, at first, in the case where a kitchen to be extended is on a first floor, a foundation is arranged on the outer peripheral portion of the floor shape. Further, the foundation of 3600 mm pitches in the longer side direction of the floor shape, and 1800 mm in the shorter direction. Then, the sleeper of 900 mm pitches in the longer side direction of the floor shape is arranged. In this case, a foundation which is superimposed on a foundation is not made. And the floor joist of 300 mm pitches in the floor shaped shorter side direction is arranged. I this case, a side floor joist is arranged in a position the same as the foundation parallel to the floor joist. Also, the ledger strip is arranged in the position the same as the foundation crossing the floor joist.

Referring now to FIG. 4, at first, columns are arranged in the vertex positions of the outer periphery of the floor shape. Then, when the furnishings exist, a pipe column is arranged in both the ends of the furnishings. And a pipe column of 450 mm pitch is arranged between a column and a column or between a column and a pipe column of the furnishing end, or between the pipe columns of the furnishing ends. Then, a pipe column of 1800 mm pitch is arranged between a column and as pipe column or a pipe column and a pipe column. Finally, a diagonal beam is arranged between the closest column and a pipe column or between a pipe column and a pipe column.

Referring not to FIG. 5, a furring strip of 450 mm pitches is constructed to the height where the wall exists above each side of the outer peripheral of the floor shape. In this case, the furring strip of the region to be occupied by the furnishings when the furnishings exist. Further, a window lintel is arranged in a position of the top end of the furnishings, and a window sill is arranged in the bottom end of the furnishings when the bottom end of the furnishings is not in contact with the floor.

Referring to FIG. 6, a pole plate is arranged on the floor-shaped outer peripheral portion when the kitchen to be extended is on a second story or more. Further, a beam of 3600 mm in pitch in the longer side direction, and 1800 mm is arranged in a shorter side direction. Then, a small beam of 900 mm in pitch is arranged in a floor shaped longer side direction. In this case, a smaller beam in a position which is superposed on the beam is not made. And the floor joist of 300 mm in pitch in the floor shaped shorter side direction. In this case, the corner joist arranged in the position same as the foundation parallel to the floor joist. Also, a ledger strip is arranged in a position the same as the foundation which crosses the floor joist.

The pitch shown FIG. 3 through FIG. 6 becomes a numeral value ⅓, ½, 1, 2, 4 times with 900 mm as a standard length. As the standard length is varies for each building, the numeral value of each pitch has only to change in proportion with the standard length in this case.

Step 7; In accordance with the above described calculation results, the estimate calculation is effected for each region to which the extension and the withdrawing have been designated.

Step 8; In accordance with the instructions of the operator, the estimate results and the room arrangement planning drawings are outputted from each types of inputting apparatus 10 in a prescribed form.

As clear from the above description, the above described invention has better points that the drafting presenting of much more effective renovation planning then before.

Then, the building renovation supporting apparatus in one embodiment of the invention where the conventional third dimensional path view hard to handle is removed will be described with reference to the drawings.

Figure 9:
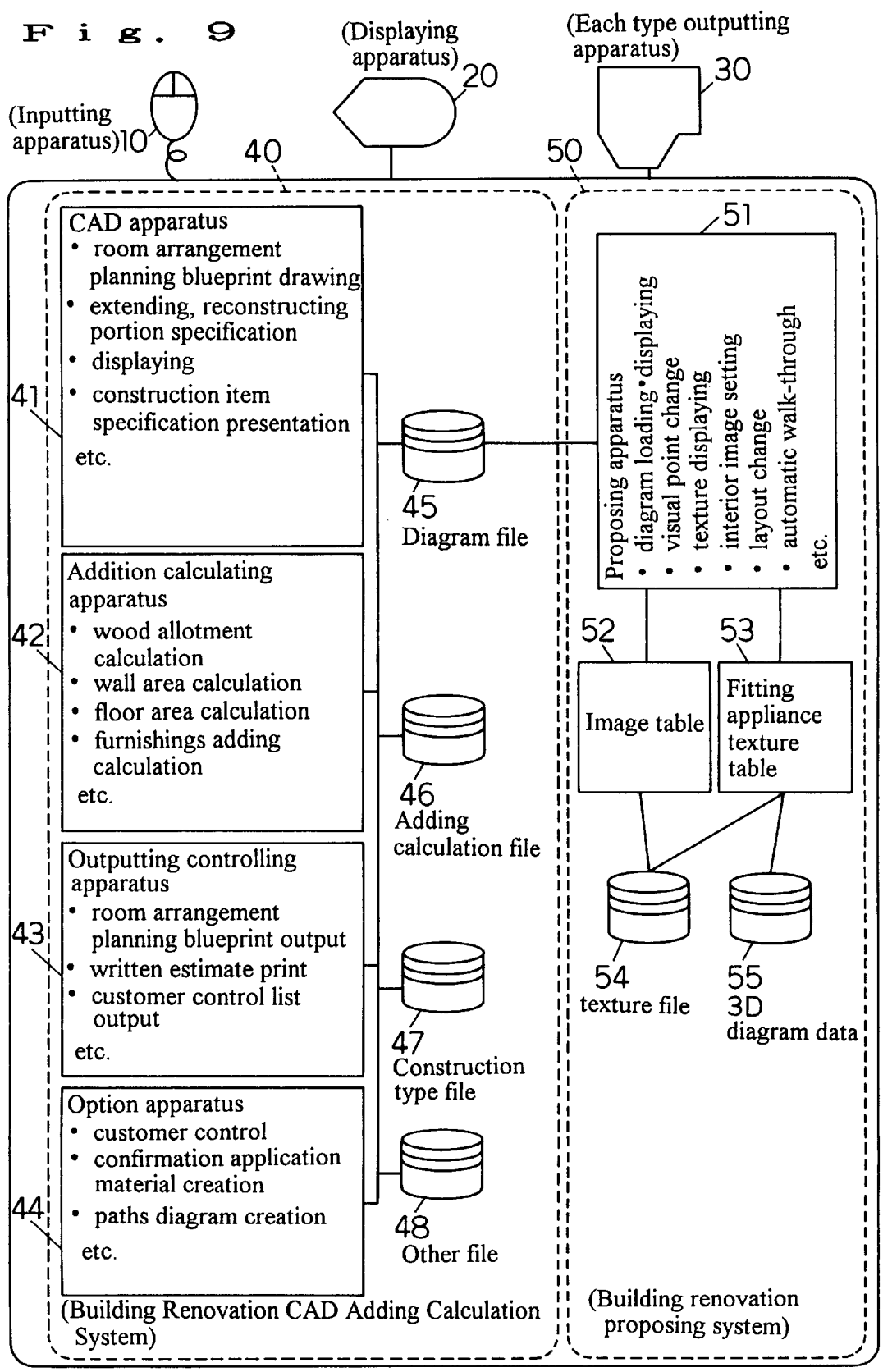
FIG. 9 is a schematic view of building the addition calculating means of the building renovation supporting CAD addition calculating system in one embodiment of the invention.

FIG. 9 shows the schematic construction of the housing renovating supporting apparatus one embodiment of the invention. The building renovating supporting apparatus is composed of an inputting apparatus including a mouth, keyboard or the like, a displaying apparatus 20 including a display and so on, various types of outputting apparatus 30 including a plotter and so on, a building renovation CAD adding calculation system 40 and a building renovation proposing system 50.

The building renovation CAD adding calculation system 40 is composed of a CAD apparatus 41 which handles drawing of the room arrangement planning blueprints, the specification of the portions to be enlarged and reconstructed, the specification or presentation of display and finishing items, an adding apparatus 42 which is in charge of wood allotting calculation, wall area calculation, floor are calculation, furnishings calculation and so on, an output controlling apparatus 43 for controlling the outputs of the room arrangement planning blueprints, printing of the written estimates, the outputs of customer charge lists, an option apparatus which is in charge of the customers cares, the making of confirmation application materials, making of path drawing, a diagram files 45 for accommodating the diagram data, a adding files 46 for accommodating the calculation data, construction file 47 for accommodating the construction type data, and other files 48 for accommodating the other data.

Input into the inputting apparatus 10 diagram information such as room arrangement planning blueprints or the like of the existing building portion or the building to be extended or reconstructed, the CAD apparatus 41 draws the room arrangement planning blueprints to present them on the displaying apparatus 20, and the diagram file 45 accommodates the room arrangement blueprints and so on, the adding apparatus 42 calculates the floor area and so on in accordance with the diagram information, and the adding file 46 accommodates the calculation results of the floor area and so on. In this case, the data accommodated within the construction type of file 47 are used for various types of construction titles, the finishes titles and so on in the CAD apparatus 41 and the adding apparatus 42. Also, the data accommodated within the other file 48 are used for the information such as the fitting appliances and so on. Also, when the room arrangement planing blueprints, the written estimates and so on are needed, the various type of outputting apparatuses 30 output by the instructions from the output controlling apparatus 43. Also, the option apparatus 44 handles the customer cares and so on when necessary.

The building renovation proposing system 50 is composed of a proposing apparatus 51 which is in charge of loading and displaying of the diagrams, changes in visual point, changes in texture, setting of interior image, changes in layout and automatic walk-through and so on, a image table 52 for setting interior images, a fitting apparatus texture table 53 for setting the shape and coloring and so on of the fitting appliances, a texture file 534 for accommodating the various types of textures, and a third dimension diagram data 55 for accommodating the 3 D diagrams.

The proposing apparatus 51 loads the room arrangement planning blueprints which are made by the building CAD adding system 49 and is accommodated by the diagram file 45 to make second dimensional or third dimensional blueprints to display on the displaying apparatus 20. The proposing apparatus 51 is linked with the image table 52 and the fitting appliances texture table 53. The image table 52 is liked with the texture file 54. The fitting appliance texture table 53 is linked with the texture file 54 and the 3D diagram data 55. The proposing apparatus 51 effects changes in visual point, changes in wall paper and floor face texture re-covering, and setting of interior image, layouts of furnishings and so on, and presentation by automatic walk-through.

Figure 10:
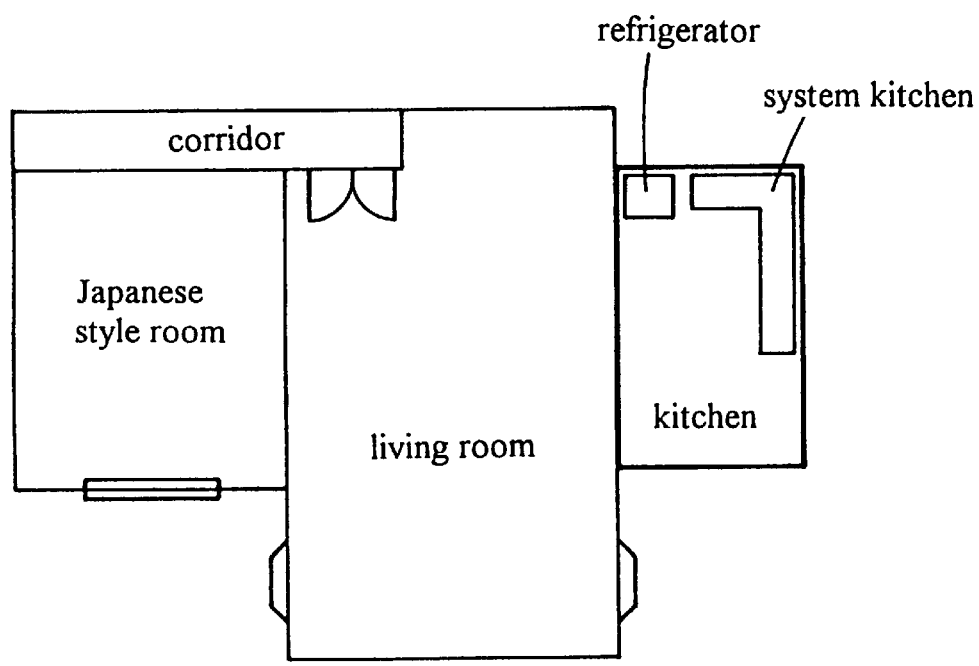
FIG. 10 is a room arrangement planing blueprint of an existing building portion and the building portion to be extended, to be constructed to be inputted to the inputting apparatus of the building renovation supporting apparatus.

FIG. 10 shows the input example of the room arrangement planning blueprint. FIG. 11(*a*), (*b*) shows the second dimensional or the third dimensional blueprint made by the proposing apparatus 51. FIG. 12 shows one example of a fitting appliance texture table 53 for setting the shape of the setting appliance or texture by the proposing apparatus. FIG. 13 shows changes in the wall paper, in the texture of the floor face or the like or one example of the image table 52 to be used in the arrangement of the interior image. FIG. 14(*a*), (*b*) shows one example of the visual point changing symbol S for effecting the movements, changes and so on in the visual point by the proposing apparatus 51. FIG. 15(*a*), (*b*) and FIG. 16(*a*), (*b*) show respectively one example of the second dimensional and third dimensional blueprints in the visual change symbol moving time. FIG. 17 shows one example of the texture list to be used by the proposing apparatus 51 in changing the texture of the wall. FIG. 18 shows one example of the secondary dimensional blueprint by the proposing apparatus 51 in changing the interior image. FIG. 19(*a*), (*b*) shows one example of the layout by the proposing apparatus 51 before the layout such as furniture and so on. FIG. 19,(*a*), (*b*) shows one example of the layout by the proposing apparatus 51 after effecting the layout for furniture and so on. FIG. 21(*a*) shows the arrangement example of the visual point change symbol S by the proposing apparatus 51 for effecting the automatic walkthrough. FIG. 21 (*b*) shows example of making the spline for effecting the automatic walk-through by the proposing apparatus 51.

The concrete operation of the building renovation supporting system of the embodiment will be described hereinafter with reference to FIG. 10 through FIG. 21.

At first, input into the inputting apparatus 10 the room arrangement planning blueprint of the existing house and draw the room arrangement planning blue print by the CAD apparatus 41. In the example, the Japanese style room and the living room are adjacent to each with-a corridor being shaped. In the renovation planning, suppose a case where a kitchen is extended, adjacent to the living room. Input into the inputting apparatus 10 the room arrangement planning in accordance with the renovation planning to draw the room arrangement planning blue print after being renovated by the CAD apparatus 41.

In the room arrangement planning blueprint after the renovation, the wall of the kitchen can be displayed with thicker lines with the use of the designation displaying function of the extending and reconstructing portions of the CAD apparatus 41. Thus, the kitchen is recognized as the extended region in the room arrangement planning. Also, the extension can be specified by the same function when the fitting appliance such as system kitchen and so on exists within the kitchen.

Then, the finishing of the construction type of files 47 is properly selected to set the construction contents for each position by the construction item setting function of the CAD apparatus 41.

Then, the addition of the walls of the extended portion only, the area of the floor and the ceiling, and accompanying furniture and fittings are effected by he adding apparatus 42. In this case, the wood choosing calculation of the extended portion only is also can be effected.

Therefore, it can be possible to make written addition and estimate of the potion to be extended and reconstructed peculiar to the renovation, which was impossible to make in the conventional building CAD adding calculation system. Also, not only such extended construction as described above, but also the partial construction of the existing wall o room can be effected.

Also, the accompanying information of the furniture, the fitting appliance and so on, the construction information of extension and reconstruction and so on can be included in addition to the concrete information such as wall, floor and so on are included in the room arrangement planning blue print to be inputted to the inputting apparatus 10. FIG. 11 is an example where these information is accommodated within the diagram file 45, the diagram data accommodated within the diagram file 45 is loaded by the proposing apparatus 51 to display the third dimensional and third dimensional blue prints. The interior materials of the body such as wall, floor, ceiling or the like and furniture such as door, window or the like are displayed on these second dimensional and third dimensional blue prints, and a condition where given texture is set is displayed on the surface of the fitting for system kitchen of the like. Namely, the building renovation support system in the present embodiment is provided with an automatic pasting function of interior materials in the embodiment.

Also, keep the ceiling height information inputted in advance, and the size of the furniture and fitting appliance are considered in advance so that the third dimensional path drawings are automatically made from the second dimensional drawing Namely, the building renovation supporting system in the present embodiment is provided with an automatic third dimensional rising function.

The automatic interior material pasting function and the automatic third dimensional rising function load the fitting appliance texture table sown in FIG. 12 and the image table shown in FIG. 13, in loading the diagram file 45, to draw in accordance with the information described in these tables.

FIG. 12 shows one example of the fitting appliance/ furnishings/furniture texture table. The article number texture corresponding to the article number and the 3D diagram data are accommodated in the fitting appliance/furnishing/ furniture texture table. When a system kitchen called, for example, the article number K105 is included in the diagram file 45, the texture called a kitchen 3 corresponding to the article number K105 is extracted from the texture file 54, The 3D diagram data called KI-I-03 corresponding to the article number K105 is extracted from the 3D diagram data 55 and are respectively displayed on the blue prints. The texture is made into group for each interior image. It is possible to set the different textures for each interior image seen in the same article number.

FIG. 13 shows one example of the image table. The interior materials corresponding to the room type, the contents of the construction setting and the texture file of the interior materials corresponding to the room type are accommodated into respective construction type of codes. These textures are accommodated into grope for each given interior image. When these textures are accommodated into group for each given interior image. When, for example, the floor of the extended western style rooms are made into modern image, the texture called floor 11 about the floor can be extracted from the texture file 54 when the floor of the construction type code 207010000. Similarly, the texture of a plurality of portions can be changed at the same time.

FIG. 14 shows an example of the visual point change symbol S to be used in the visual point change on the display blue print. The visual point change symbol S is composed of a portion for setting a visual position C, a portion for setting a line of sight direction A and a portion for setting a view angle B as shown in FIG. 14. The user catches a portion for setting a visual point in the visual point changing symbol S with the use of the inputting apparatus 10 so that the view-point can be changed (corresponding to the realization of each type of condition of the symbol diagram) by moving it into a given position on the drawing, holding the portion of arrow in a line of sight direction in the visual point changing symbol S so that the line of sight direction can be changed (corresponding to the realization of each type of condition of the symbol diagram) by the turning the visual point change symbol S by a given angle portion, and catches a bottom side portion of an triangle representing the view angle in the visual point changing symbol S so that the view angle can be changed (correspond to the realization of the various types condition of the symbol diagram) by narrowing or widening. FIG. 14(*a*) shows when the view angle B is narrowed, and FIG. 14 (*b*) shows a case when the view angle B has been widened.

Also, referring to FIG. 15 and FIG. 16, such a third dimensional view as shown in (*b*) is displayed when the visual point changing symbol S is moved, rotated on the drawing of the second dimensional diagram as shown in the (*a*). FIG. 15 shows a case seen from the front, and FIG. 16 shows a case when seen from the right slight direction. It is possible to walk throughout the room by moving and rotating of a vial point change symbol in the above described method.

FIG. 17 shows a display example of the texture list to be used in texture change. The texture list is made for each furniture for each interior material such as wall, floor or the like, each fitting article such as system kitchen, each furniture such as curtain or the like or each room type and interior image. A use selects his favorite texture from among the texture list with the use of the inputting apparatus 10 to change the texture on the drawing at the real time. Such texture list can be added reduced improved easily in contents.

FIG. 18 shows the change example of the interior image. FIG. 18(*a*) shows one example in a case where the living has been integrated into a modern image, and FIG. 18 (*b*) shows one example of a case where the living has been integrated into natural image. The user select his favorite image from among some interior images to extract from the texture file 54 the corresponding texture, by referring to image table shown in FIG. 13 by the proposing apparatus 51, to reflect it on the display view. By the function, approximate atmosphere can be made or wall, curtains individually or texture change changed. The proprietor can realize on the blue print the finishing image of he renovation vaguely. As the result, the image gap caused between the constructor and the proprietor can be removed.

FIG. 19 and FIG. 20 show one example where the lay out of the furniture such as desk, chair, book shelf and so on is planned. FIG. 19 shows the layout front. FIG. 20 shows the layout reverse. FIG. 20 is an example where a round table 110 is put into the kitchen.

At first, as shown in FIG. 19(a), the visual point change symbol S is moved, onto the secondary dimensional blue print, into a room where the furniture is placed. Then, the furniture list same as such texture list as shown in FIG. 17 is actuated to select a furniture from among the furniture list with the use of the inputting apparatus 10 for placement on the secondary dimensional or third dimensional blue print as shown in FIG. 20. As the matching with the finishing of the interior decoration can be confirmed by the actual arrangement of the existing furniture or furniture to e purchased newly, rearrangement of furniture accompanied by the renovation can be made helpful, thus helping the proprietor support in detail. FIG. 21 shows one example of an automatic walk through function in the proposing apparatus 51. As shown in FIG. 21 (a), a spline is made through connection of one line in accordance with a plurality of visual point change symbols S in a given order, as shown in FIG. 21 (b), after placement of a plurality of visual point change symbol S changed in either of position, line of sight direction and view angle on the secondary dimensional blueprint.

Then, suppose that the boundary pint is an interpolation position of an interpolating visual point change symbol SP with the spline-on being divided into five or ten.

The automatic walk through operation is effected by third dimensional drawing displaying one after another about each visual point change symbols S, SP . . . , arranged in a given order, including the interpolating visual point change symbol SP made in this manner.

Select and load an optimum spline from among these files when necessary, in a condition where spline as described above being accommodated in a files of several types, and various type of presentation can be provided for the proprietors.

Also, connect with straight lines, instead of connecting the visual change symbol S with spline.

Also, the various types of condition of symbol diagrams of the invention include not only specification of the position of the symbol diagram into a plurality positions, various directions of the symbol diagrams, various angles of symbol diagrams, as described above, but also other various types of condition such as deformation into symbol diagrams themselves, enlargement, construction and so on of the size of the symbol diagrams.

In the invention, all the programs or partial programs for putting the computer into practice the functions of all the means or partial means of the respective means (including elements, apparatuses, appliances and so on) in the above described all the inventions.

Also, the above described invention for simplifying the provision of the third dimensional pass view is adapted to exhibit the following effects.

Namely, according to the building renovation supporting apparatus of the invention of the claim 9, the user can grasp the finish image of he building after the renovation, because renovation blue prints can be obtained in accordance with the respective construction such as extending, reconstructing or withdrawing in a particular region. Therefore, the image gap between the constructor side and the construction order side can e reduced as efficient renovation planning can be obtained before the construction starts.

According to the building reform supporting apparatus of the invention of the claim 10, the user can grasp further correct finishing image of the building after being renovated, because renovation blue prints with textures being attached with body, furnishings and fitting.

According to the building reform supporting apparatus of the invention of the claim 11, the user can grasp in third dimension the finishing image after being reformed, because a proposing means can make renovating blue prints composed three dimensional path views in according with the information of the ceiling height inputted into the inputting means.

According to the building renovation supporting apparatus of the invention of the claim 12, the user can grasp in third dimension the finishing image after being renovated from a vie w point of desired view-point, visual lien direction and a view angle.

According to the building renovation supporting apparatus of the invention of the claim 13, the user can grasp the finishing image after being renovated variously in viewpoint, the line of sight direction and the view angle.

According to the building renovation supporting apparatus of the invention of the claims 14, 15, 16, the user can grasp of the finishing image after being renovated from a view pint of visual position, visual direction and the view angle even in the interpolating position where inputting operation is not effected. Namely, the user can grasp the finishing image begin being renovated, walking through automatically.

According to the building renovation supporting apparatus of the invention of he claim 20, renovation blue prints with textures are attached with body, furnishing, fixing appliance and furniture can be made.

According to the building renovation supporting apparatus of the invention of the claim 21, the user can grasp the finishing image after being renovated in an arrangement of the furniture.

According to the building renovation supporting apparatus of the invention of the claim 24, the user can grasp the textures integrated in interior image in body, furnishing, fixing appliance and furniture can be made.

According to the building renovation supporting apparatus of the invention of the claim 25, the user can grasp the finishing image after being renovated in an arrangement of the furniture.

According to the building renovation supporting apparatus of the invention of the claim 25, adding calculation and estimation can be obtained in accordance with extended, reconstructed or withdrawing construction.

What is claimed is:

1. A building renovation supporting system comprising;
   a room arrangement planning information inputting means for inputting a room arrangement planing blueprint of an existing building portion and/or a room arrangement planning blueprint of a newly desired building portion to be extended or repaired;
   a furnishings information inputting means for inputting data about the types of furnishings of the existing building portion and/or data about the types of the furnishings of the newly desired building portion;
   a fittings information inputting information for inputting data about the types of the fittings of the existing building portion and/or data about the types of the fittings of the newly desired building portion;
   a displaying means for displaying all the types of information or partial information to be inputted by the room arrangement planning blueprint inputting means, the furnishings information inputting means, the fittings information inputting means;

a region specifying means for specifying one or a plurality of regions from among the display contents to be displayed by the displaying means;

a selecting means for selecting at least extending, withdrawing or repairing in accordance with a region by the region specifying means;

a addition calculating means for effecting adding calculation to be required for the withdrawing in accordance with various types of information of the existing building portion inputted, and the finishing contents of the existing building portion to be specified, about the region selected withdrawing by the selecting means, for effecting adding calculation to be required for the extending in accordance with various types of information of the newly desired building portion inputted and a desired finishing contents to be specified about the region selected the extending, or for effecting adding calculation to be required for the repairing in accordance with various types of information of the existing building portion and the newly desired building portion inputted and the finishing contents of the existing building portion to be specified and the desired finishing contents to be specified about the region selected the repairing;

an estimating means for effecting estimation calculation at least for each region to be specified in accordance with the adding calculation results by the addition calculating means;

characterized in that room arrangement planning drawing, extending, repairing portion displaying, and finishing item displaying are effected or written adding calculation estimation of the extending, repairing or withdrawing portion only are created by specifying of a portion to be extended, reaping or withdrawn, by the use of at least a diagram file for accommodating the diagram information of the room arrangement planning blueprint, an adding calculation file for accommodating the various of adding calculation results, and a construction type file for accommodating a construction title and a finishing title predetermined.

2. A building renovation supporting system comprising;

a room arrangement planning information inputting means for inputting a room arrangement planing blueprint of an existing building portion and/or a room arrangement planning blueprint of a newly desired building portion to be extended or repaired;

a furnishings information inputting means for inputting data about the types of furnishings of the existing building portion and/or data about the types of the furnishings of the newly desired building portion;

a fittings information inputting information for inputting data about the types of the fittings of the existing building portion and/or data about the types of the fittings of the newly desired building portion;

a displaying means for displaying all the types of information or partial information to be inputted by the room arrangement planning blueprint inputting means, the furnishings information inputting means, the fittings information inputting means;

a region specifying means for specifying one or a plurality of regions from among the display contents to be displayed by the displaying means;

a selecting means for selecting at least extending, withdrawing or repairing in accordance with a region by the region specifying means;

a addition calculating means for effecting adding calculation to be required for the withdrawing in accordance with various types of information of the existing building portion inputted, and the finishing contents of the existing building portion to be specified, about the region selected withdrawing by the selecting means, for effecting adding calculation to be required for the extending in accordance with various types of information of the newly desired building portion inputted and a desired finishing contents to be specified about the region selected the extending, or for effecting adding calculation to be required for the repairing in accordance with various types of information of the existing building portion and the newly desired building portion inputted and the finishing contents of the existing building portion to be specified and the desired finishing contents to be specified about the region selected the repairing;

an estimating means for effecting estimation calculation at least for each region to be specified in accordance with the adding calculation results by the addition calculating means;

characterized in that room arrangement planning drawing, the extending, repairing portion displaying, and the finishing item displaying, when various types of furnishings are set with respect to portions to be extended, repaired or withdrawn for effecting the calculation necessary for estimation, to present only finishing items related to each position for selecting the furnishings presented, by the use of at least a diagram file for accommodating the diagram information of the room arrangement planning blueprint, an adding calculation file for accommodating the various of adding calculation results, and a construction type file for accommodating a construction title and a finishing title predetermined.

3. A building renovation supporting system comprising;

a room arrangement planning information inputting means for inputting a room arrangement planing blueprint of an existing building portion and/or a room arrangement planning blueprint of a newly desired building portion to be extended or repaired;

a furnishings information inputting means for inputting data about the types of furnishings of the existing building portion and/or data about the types of the furnishings of the newly desired building portion;

a fittings information inputting information for inputting data about the types of the fittings of the existing building portion and/or data about the types of the fittings of the newly desired building portion;

a displaying means for displaying all the types of information or partial information to be inputted by the room arrangement planning blueprint inputting means, the furnishings information inputting means, the fittings information inputting means;

a region specifying means for specifying one or a plurality of regions from among the display contents to be displayed by the displaying means;

a selecting means for selecting at least extending, withdrawing or repairing in accordance with a region by the region specifying means;

a addition calculating means for effecting adding calculation to be required for the withdrawing in accordance with various types of information of the existing building portion inputted, and the finishing contents of the existing building portion to be specified, about the region selected withdrawing by the selecting means, for effecting adding calculation to be required for the extending in accordance with various types of information of the newly desired building portion inputted and a desired finishing contents to be specified about the region selected the extending, or for effecting adding calculation to be required for the repairing in accordance with various types of information of the existing building portion and the newly desired building portion inputted and the finishing contents of the existing building portion to be specified and the desired finishing contents to be specified about the region selected the repairing;

an estimating means for effecting estimation calculation at least for each region to be specified in accordance with the adding calculation results by the addition calculating means;

characterized in that room arrangement planning drawing, the extending, repairing portion displaying, and the finishing item displaying, when various types of furnishings are set with respect to portions to be extended, repaired or withdrawn for effecting the calculation necessary for estimation, to present only finishing items related to each position for selecting the furnishings presented or for automatically setting the construction information of the finishing default, by the use of at least a diagram file for accommodating the diagram information of the room arrangement planning blueprint, an adding calculation file for accommodating the various of adding calculation results, and a construction type file for accommodating a construction title and a finishing title predetermined.

4. A building renovation supporting system of claim 1, wherein the calculation necessary for estimation is to effect all the or partial calculation about wall, floor or ceiling area, the adding calculation of furnishings, the adding calculation of fittings, the calculation of wood choosing.

5. A building renovation supporting system of claim 4 wherein the wood choosing calculation among the calculation necessary for estimation in the addition calculating means effects a foundation position information creation of a position the same as on the outer periphery of the floor of the first story floor, arranged in a given interval in the one coordinates axis direction of the CAD within the first story floor-shape or arranged in a given interval in a direction vertical to the one coordinates axis of the CAD within the first story floor-shape; effects sleeper position information creation arranged in a given interval in the one coordinates axis direction of the CAD in a position where the foundation is not superimposed on the interior of the first story floor-shape; effects floor joist position information creation arranged in a given interval to a direction vertical to the sleeper in a position where the foundation is not superimposed on the interior of the first story floor-shape; effects corner joist position information creation in the position the same as the foundation parallel to the floor joist; effects ledger strip position information creation in the position the same as the foundation which crosses the floor joist in accordance with the first story floor-shape to be obtained from the room arrangement planning information at least already inputted.

6. A building renovation supporting system of claim 4 wherein the wood choosing calculation among the calculation necessary for estimation in the addition calculating means effects column position information creation at a polygon vertex representing the outer periphery of the floor; effects a pipe column position information creation in both the end positions of the furnishings of the furnishings information inputted; effects the pipe column position information creation in a given interval between the column and the pipe columns at both the ends of the furnishings, and between the pipe columns at both the ends of the furnishings and the pipe columns at both the ends of the furnishings; effects the stud position information creation in a given interval in a position which is not superimposed on the pipe column between the column and the pipe columns at both the ends of the furnishings, and between the pipe columns at both the ends of the furnishings and the pipe columns at both the ends of the furnishings; effects the diagonal position information creation between the column and the pipe columns at both the ends of the furnishings, and between the pipe columns at both the ends of the furnishings and the pipe columns at both the ends of the furnishings in accordance with the floor shape to be obtained from the room arrangement planning blueprint at least already inputted.

7. A building renovation supporting system of claim 4 wherein the wood choosing calculation among the calculation necessary for estimation in the addition calculating means effects furring strip position information creation of a region arranged in a given interval in a height direction and having the furnishings of the inputted furnishings information except for a horizontal direction the same as the outer periphery of the floor; effects the window lintel position information in the position the same as the top end of the furnishings of the inputted furnishings information;

effects window-sill position information creation in the position the same as the bottom end of the furnishings when the bottom end of the furnishings is not in contact with the floor in the inputted furnishings information in accordance with the floor shape to be obtained from the room arrangement planning information at least already inputted.

8. A building renovation supporting system of claim 4 wherein the wood choosing calculation necessary for estimation in the addition calculating means effects a pole plate beam position information creation in the position the same as the outer periphery of the floor on the second floor or higher; effects beam position information creation arranged in a given interval in one coordinates axis direction of the CAD within the floor shape of the second story or higher, arranged in a given interval in a direction vertical to one coordinates axis of the CAD within the floor shape of the second story or higher, effects small beam position information creation arranged in a given interval in the one coordinates axis direction of the CAD in a position which is not superimposed on the beam within the interior of the floor shape of the second story or higher; effects floor joist position information creation arranged in a given interval in a direction vertical to the small beam in a position which is not superimposed on the beam within the floor shape of the second story or higher, effects corner joist position information creation in a position the same as the pole plate and the beam parallel to the floor joist, and effects ledger strip position information creation in the position the same as the pole plate and the beam which cross the floor joist in accordance with the floor shape of the second story or higher to be obtained from the room arrangement planning blueprint information at least already inputted.

9. A building renovation supporting apparatus comprising;

an inputting means to which at least one of the room arrangement planning blueprint of the existing building portion including the body information about body such as wall, floor and so on, furnishings information showing the types of the furnishings, and fittings information showing the types of the fittings, and room arrangement planning blueprint of building portion to be extended or reconstructed including the furnishings information and the fittings information are inputted;

a displaying means for displaying at least one of the body information, furnishings information and the fittings information in the room arrangement planning blueprint inputted by the inputting means;

a region specifying means for specifying a particular region in at least partial portion displayed by the displaying means;

a construction selecting means for selecting the types of the construction composed of either of the extending construction, the repairing construction and the withdrawing construction with respect to a particular region specified by the region specifying means;

a proposing means for creating second dimensional or third dimensional renovating blueprints in accordance with the room arrangement planning blueprint inputted by the inputting means, the particular region specified by the region specifying means, and the type of the construction selected by the construction selecting means.

10. A building renovation supporting apparatus of claim 9 wherein the proposing means creates the renovating blueprints with the body, furnishings and fittings being provided with a given texture in accordance with the room arrangement planning blueprint inputted by the inputting means, the particular region specified by the region specifying means, and the type of the construction selected by the construction selecting means.

11. A building renovation supporting apparatus of claim 9 wherein the proposing means creates the renovating blueprints composed of third dimensional path diagram in accordance with the height information when the ceiling height information is inputted to the inputting means.

12. A building renovation supporting apparatus of claim 11 wherein the proposing means creates the renovation blueprints composed of a third dimensional path diagram of particular view-point, the line of sight direction and the view angle corresponding to respective types of condition of the symbol diagrams to be inputted from the inputting means with many view-point information, line of sight dimension formation and view angle information necessary for direction the third dimensional path diagram corresponding to respective types of condition of the one type of symbol diagram respectively.

13. A building renovation supporting apparatus of claim 12 wherein the respective types of condition of the symbol diagram to be inputted by the inputting means is plural, namely, a plurality of visual point positions are inputted and the given line of sight direction, view angle are inputted corresponding to the respective visual point positions, further are inputted, further the order of the displaying is inputted.

14. A building renovation supporting apparatus of claim 12 wherein the respective types condition of the symbol diagram to be inputted by the inputting means h is plural, namely, a plurality of visual point positions are inputted and the given line of sight direction, view angle are inputted corresponding to the respective each visual point positions, line information for connecting the plurality of visual point positions, the proposing means divides the line for connecting two visual point positions into a given number with the division being an additional view-point (interpolating view-point), the line of sight direction, the view angle in the interpolating position are obtained from the line of sight direction, the view angle in two visual point positions for connecting the lines.

15. A building renovation supporting apparatus of claim 14 wherein the line information connects with linear line two visual point positions inputted.

16. A building renovation supporting apparatus of claim 14 wherein the line information connects in spline the a plurality of visual point positions inputted.

17. A building renovation supporting apparatus of claim 12 wherein the proposing means creates the third dimensional path view to output it in accordance with one set of respective information whenever one set of the viewpoint information, the line of sight direction and view angle information are inputted.

18. A building renovation supporting apparatus of claim 12 wherein the proposing means creates the third dimensional path view to output it in accordance with these sets of respective information after one set of the viewpoint information, the line of sight direction and view angle information are inputted.

19. A building renovation supporting apparatus of claim 18 wherein the proposing means smoothly effects the movement of the view-point, the rotation of the line of sight direction and the enlargement of the view angle, the contraction.

20. A building renovation supporting apparatus of claim 11 wherein the proposing means has a parts accommodating means so that the furnishings can be replaced by furnishings parts having shape information composed of width, length, height, and information of texture to be fixed on the surface of the furnishings.

21. A building renovation supporting apparatus of claim 20 wherein the proposing means selects furnishings parts corresponding to the parts selecting instructions to be inputted to the inputting means from among the furnishings parts the parts accommodating means accommodates to create the renovation blueprints composed of third dimensional path diagrams by drawing the selected furnishings parts in a position corresponding to the furnishings position to be inputted by the inputting means.

22. A building renovation supporting apparatus of claim 11 wherein the proposing means has a texture accommodating means where textures to be provided with the body, furnishings, fittings appliances and furnishings are respectively accommodated.

23. A building renovation supporting apparatus of claim 22 wherein the proposing means selects a texture corresponding to the texture selecting instructions to be inputted to the inputting means from among the textures the texture accommodating means accommodates to create the renovation blueprints composed of third dimensional path with the selected textures being provided on the body furnishings, fittings appliance and furniture.

24. A building renovation supporting apparatus of claim 11 wherein the proposing means has a texture accommodating means, which divides the textures to be fixed on the body, furnishings, fittings appliances and furniture into groups for each given interior image.

25. A building renovation supporting apparatus of claim 24 wherein the proposing means selects a texture belonging to the given interior image to be inputted to the inputting means from among the textures the texture accommodating means accommodates for the body, furnishing, fittings appliances and furnishing in a room corresponding to the room selecting instructions to be inputted to the inputting means to create the renovation blueprints composed of third dimensional path with the selected textures being provided on the body furnishings, fittings appliance and furniture.

26. A building renovation supporting comprising a addition calculating means effects addition calculating building extension in accordance with the body information, furnishing information, fittings information and finishing contents to be inputted to the inputting means about a particular region specified by the region specifying means when the construction selecting means has selecting the building extending construction, effects adding calculating of reconstruction in accordance with the body information, furnishing information, fittings information and finishing contents to be inputted to the inputting means about a particular region specified by the region specifying means when the construction selecting means has selecting the building extending construction, effects addition calculating of withdrawing in accordance with the body information, furnishing information, fittings information and finishing contents to be inputted to the inputting means about a particular region specified by the region specifying means when the construction selecting means has selecting the building extending construction, an estimating means for crating the estimate for building extension, estimate for reconstruction or estimate for withdrawing in accordance with results of the addition calculation for the building extension, the addition calculation for reconstruction or the addition calculation for withdrawing.

27. A information recording medium wherein all the programs or partial programs for causing a computer function of the all or partial means of respectively means described in the claim 1 are recorded.

\* \* \* \* \*